(12) United States Patent
Shibata et al.

(10) Patent No.: US 12,026,870 B2
(45) Date of Patent: Jul. 2, 2024

(54) MANUFACTURING MANAGEMENT METHOD

(71) Applicant: NEC Corporation, Tokyo (JP)

(72) Inventors: Takashi Shibata, Tokyo (JP); Toru Takahashi, Tokyo (JP); Rui Ishiyama, Tokyo (JP); Keiko Inoue, Tokyo (JP); Kota Iwamoto, Tokyo (JP); Hiroyoshi Miyano, Tokyo (JP); Emi Kitagawa, Tokyo (JP); Yasuhiko Yoshida, Tokyo (JP)

(73) Assignee: NEC CORPORATION, Tokyo (JP)

( * ) Notice: Subject to any disclaimer, the term of this patent is extended or adjusted under 35 U.S.C. 154(b) by 502 days.

(21) Appl. No.: 17/432,982

(22) PCT Filed: Feb. 27, 2019

(86) PCT No.: PCT/JP2019/007667
§ 371 (c)(1),
(2) Date: Aug. 23, 2021

(87) PCT Pub. No.: WO2020/174625
PCT Pub. Date: Sep. 3, 2020

(65) Prior Publication Data
US 2022/0164937 A1    May 26, 2022

(51) Int. Cl.
*G06T 7/00* (2017.01)
(52) U.S. Cl.
CPC .... *G06T 7/001* (2013.01); *G06T 2207/30108* (2013.01); *G06T 2207/30196* (2013.01)
(58) Field of Classification Search
CPC ..... G06T 7/0002; G06T 7/0004; G06T 7/001; G06T 2207/30108; G06T 2207/30164; G06T 2207/30196; G06Q 50/04; G05B 19/048; G05B 19/418; G05B 19/4183; G05B 19/4184; G05B 19/41875; H05K 13/08; H05K 13/081; H05K 13/083; H05K 13/084
See application file for complete search history.

(56) References Cited

U.S. PATENT DOCUMENTS

2013/0226643 A1  8/2013  Sakaue et al.
2017/0093956 A1  3/2017  Ito

FOREIGN PATENT DOCUMENTS

JP   2005-242418 A   9/2005
JP   2013-003688 A   1/2013
(Continued)

OTHER PUBLICATIONS

Machine translation of JP 2005-242481 A (Year: 2005).*
(Continued)

*Primary Examiner* — Andrew W Johns
(74) *Attorney, Agent, or Firm* — Sughrue Mion, PLLC

(57) ABSTRACT

A manufacturing management device 100 includes an acquisition unit 121 that acquires unique information of a product from a captured image of the product captured in a manufacturing step included in a manufacturing process of the product, and acquires operation information representing an operation of a person who performs a manufacturing work on the product in the manufacturing step, and an association unit 122 that sores the acquired unique information of the product and the acquired operation information in association with each other.

20 Claims, 25 Drawing Sheets

(56) References Cited

FOREIGN PATENT DOCUMENTS

| JP | 2013-174980 A | 9/2013 |
|----|---------------|--------|
| JP | 2015-232853 A | 12/2015 |
| JP | 2016-42332 A | 3/2016 |
| JP | 2016-100527 A | 5/2016 |

OTHER PUBLICATIONS

Machine translation of JP 2016-100527 A (Year: 2016).*
International Search Report for PCT Application No. PCT/JP2019/007667, dated Jun. 4, 2019.
Ishiyama Rui et al., "Individual Recognition Based on the Fingerprint of Things Expands the Applications of IoT", NEC Technical Journal, 2016, vol. 69, No. 1, pp. 42-46, ISSN 0285-4139.
JP Office Action for JP Application No. 2021-501468, dated Aug. 22, 2023 with English Translation.
NEC, "NEC, Industrial products and components," the first place of the world's "object fingerprint authentication technology" Applicability to traceability / authenticity Determination / Quality Management, -, [online, Nov. 10, 2014, press release of web page of NEC (NEC Corporation), [search on August 2, Reiwa 5 (2023)], Internet<URL:https://jpn.nec.com/press/201411/20141110_01.html>.

* cited by examiner

Fig.3

| MANUFACTURING STEP | OPERATION DATA |
|---|---|
| A | OPERATION a (COMPONENT NAME, MOUNTING DIRECTION) |
| B | OPERATION b (WORKING TIME) |
| C | OPERATION c (TOOL NAME) |

| INDIVIDUAL NO. | OBJECT FINGERPRINT | OPERATION | | | | |
|---|---|---|---|---|---|---|
| | | STEP A (OPERATION a) | STEP B (OPERATION b) | STEP C (OPERATION c) | ... | STEP X (...) |
| 1 | xxxxxxxxxx | COMPONENT Ea1, LEFT (xxx.mpg) | xx SECONDS (xxx.mpg) | TOOL Tc1 (xxx.mpg) | ... | ... |
| 2 | xxxxxxxxxx | COMPONENT Ea1, LEFT (xxx.mpg) | xx SECONDS (xxx.mpg) | TOOL Tc1 (xxx.mpg) | ... | ... |
| 3 | xxxxxxxxxx | COMPONENT Ea1, LEFT (xxx.mpg) | xx SECONDS (xxx.mpg) | TOOL Tc1 (xxx.mpg) | ... | ... |
| 4 | xxxxxxxxxx | COMPONENT Ea1, LEFT (xxx.mpg) | xx SECONDS (xxx.mpg) | TOOL Tc1 (xxx.mpg) | ... | ... |
| ... | | | | | | |

Fig.5

| INDIVIDUAL NO. | RANK |
|---|---|
| 1 | R1 |
| 2 | R1 |
| 3 | R2 |
| 4 | R3 |

RANK: R1, 2

| INDIVIDUAL NO. | OBJECT FINGERPRINT | OPERATION | | | |
|---|---|---|---|---|---|
| | | STEP A (OPERATION a) | STEP B (OPERATION b) | STEP C (OPERATION c) | STEP X (...) |
| 1 | xxxxxxxxxx | COMPONENT Ea1, LEFT (xxx.mpg) | xx SECONDS (xxx.mpg) | TOOL Tc1 (xxx.mpg) | ... |
| 2 | xxxxxxxxxx | COMPONENT Ea1, LEFT (xxx.mpg) | xx SECONDS (xxx.mpg) | TOOL Tc1 (xxx.mpg) | ... |
| 3 | xxxxxxxxxx | COMPONENT Ea1, LEFT (xxx.mpg) | xx SECONDS (xxx.mpg) | TOOL Tc1 (xxx.mpg) | ... |

...

RANK: R3

| INDIVIDUAL NO. | OBJECT FINGERPRINT | OPERATION | | | |
|---|---|---|---|---|---|
| | | STEP A (OPERATION a) | STEP B (OPERATION b) | STEP C (OPERATION c) | STEP X (...) |
| 4 | xxxxxxxxxx | COMPONENT Ea1, LEFT (xxx.mpg) | xx SECONDS (xxx.mpg) | TOOL Tc1 (xxx.mpg) | ... |
| 7 | xxxxxxxxxx | COMPONENT Ea1, LEFT (xxx.mpg) | xx SECONDS (xxx.mpg) | TOOL Tc1 (xxx.mpg) | ... |

RANK: R1, 2

| INDIVIDUAL NO. | OBJECT FINGERPRINT | OPERATION | | | |
|---|---|---|---|---|---|
| | | STEP A (OPERATION a) | STEP B (OPERATION b) | STEP C (OPERATION c) | ... | STEP X (...) |
| 1 | xxxxxxxxxx | COMPONENT Ea1, LEFT (xxx.mpg) | xx SECONDS (xxx.mpg) | TOOL Tc1 (xxx.mpg) | ... | ... |
| 2 | xxxxxxxxxx | COMPONENT Ea1, LEFT (xxx.mpg) | xx SECONDS (xxx.mpg) | TOOL Tc1 (xxx.mpg) | ... | ... |
| 3 | xxxxxxxxxx | COMPONENT Ea1, LEFT (xxx.mpg) | xx SECONDS (xxx.mpg) | TOOL Tc1 (xxx.mpg) | ... | ... |

⎬ Y1

RANK: R3

| INDIVIDUAL NO. | OBJECT FINGERPRINT | OPERATION | | | |
|---|---|---|---|---|---|
| | | STEP A (OPERATION a) | STEP B (OPERATION b) | STEP C (OPERATION c) | ... | STEP X (...) |
| 4 | xxxxxxxxxx | COMPONENT Ea1, LEFT (xxx.mpg) | xx SECONDS (xxx.mpg) | TOOL Tc1 (xxx.mpg) | ... | ... |
| 7 | xxxxxxxxxx | COMPONENT Ea1, LEFT (xxx.mpg) | xx SECONDS (xxx.mpg) | TOOL Tc1 (xxx.mpg) | ... | ... |

⎬ Y2

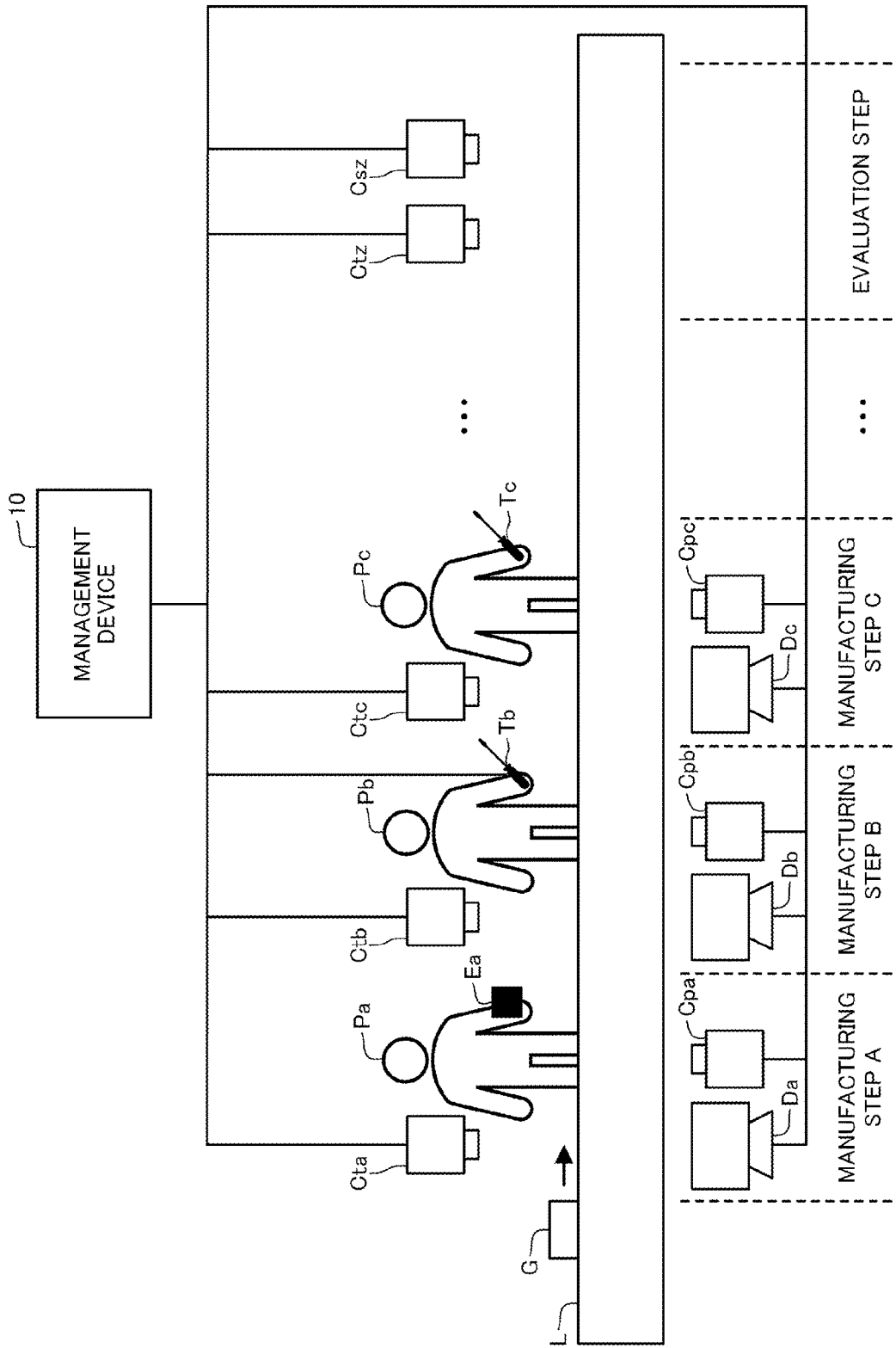

Fig.15

RANK: R1, 2

| INDIVIDUAL NO. | OBJECT FINGERPRINT | OPERATION | | | |
|---|---|---|---|---|---|
| | | STEP A (OPERATION a) | STEP B (OPERATION b) | STEP C (OPERATION c) | STEP X (...) |
| 11 | xxxxxxxxxx | COMPONENT Ea1, LEFT (xxx.mpg) | xx SECONDS (xxx.mpg) | TOOL Tc1 (xxx.mpg) | ... |
| 12 | xxxxxxxxxx | COMPONENT Ea1, LEFT (xxx.mpg) | xx SECONDS (xxx.mpg) | TOOL Tc1 (xxx.mpg) | ... |
| 13 | xxxxxxxxxx | COMPONENT Ea1, LEFT (xxx.mpg) | xx SECONDS (xxx.mpg) | TOOL Tc1 (xxx.mpg) | ... |

Y11

...

RANK: R3

| INDIVIDUAL NO. | OBJECT FINGERPRINT | OPERATION | | | |
|---|---|---|---|---|---|
| | | STEP A (OPERATION a) | STEP B (OPERATION b) | STEP C (OPERATION c) | STEP X (...) |
| 14 | xxxxxxxxxx | COMPONENT Ea2, LEFT (xxx.mpg) | xx SECONDS (xxx.mpg) | TOOL Tc1 (xxx.mpg) | ... |
| 17 | xxxxxxxxxx | COMPONENT Ea2, LEFT (xxx.mpg) | xx SECONDS (xxx.mpg) | TOOL Tc1 (xxx.mpg) | ... |

Y12

...

MANUFACTURING MANAGEMENT METHOD

This application is a National Stage Entry of PCT/JP2019/007667 filed on Feb. 27, 2019, the contents of all of which are incorporated herein by reference, in their entirety.

TECHNICAL FIELD

The present invention relates to a manufacturing management method, a manufacturing management device, and a program.

BACKGROUND ART

Recently, in a manufacturing premise of the manufacturing industry, manufacturing history such as machining and inspection of each of the products to be manufactured is accumulated and analyzed as big data, which are utilized to improve the quality management and the production efficiency, and also to improve the design and machining accuracy. In particular, product quality management is important. It is necessary to specify the factor of the quality evaluated for each product by tracking back the manufacturing history of each product.

In order to accumulate the manufacturing history of each product, it is necessary to identify an individual that is a product itself. That is, by acquiring individual identification information of a product flowing through the manufacturing line, and storing the individual identification information in association with the manufacturing state information, it is possible to acquire the manufacturing history.

Here, for individual identification of a product, the product may be given with a manufacturing number or a bar code, or attached with a tag such as a Radio Frequency IDentifier (RFID). However, in the case of performing individual identification using a manufacturing number, a bar code, or a tag as described above, it is necessary to apply it to each product, which causes a problem of a cost increase. Moreover, for a small product such as a screw, a bolt, or a tablet, there is a case where a manufacturing number, a bar code, or a tag cannot be given due to a restriction in the size or product characteristics. Furthermore, even for a product to which a bar code, a tag, can be given physically, a problem of impairing the appearance or design of the product may be caused.

To cope with it, in recent years, an object fingerprint authentication technology for performing individual identification using a fine pattern (object pattern) of a surface of a product has been proposed. Specifically, in the object fingerprint authentication technology, individual identification of a product is performed by acquiring a fine pattern that is naturally generated in the manufacturing process of the product such as a random pattern on a surface of a material, as an image with use of a capturing device such as a camera, and identifying the fine pattern.

Patent Literature 1 discloses an example of managing product quality using the object fingerprint authentication technology described above. In Patent Literature 1, a surface of a product is captured and surface pattern information is acquired, and the surface pattern information is stored in a database in association with relevant information of manufacturing such as manufacturing date/time, manufacturing conditions such as temperature and humidity at the time of manufacturing, and IDs of the manufacturing factory and the manufacturing line. Thereafter, in response to a request from a user or a distributor, the relevant information of manufacturing the product is specified by collating the surface pattern information of the actual product and the surface pattern information stored in the database.

As another method of managing product quality, a method of checking the operation of a worker, as disclosed in Patent Literature 2, as been known. In Patent Literature 2, by capturing a working place where the work is performed on a product, it is inspected whether or not the contents of work by a worker satisfies the contents of the standard work.

Patent Literature 1: JP 2015-232853 A
Patent Literature 2: JP 2016-42332 A

SUMMARY

However, in the technology described in Patent Literature 1, only rough information related to manufacturing such as manufacturing date/time, manufacturing conditions, and manufacturing place can be specified from the surface pattern information of the product. Therefore, there is a problem that even in the case where the product quality is caused by the operation of a person involved in the manufacturing of the product, such a fact cannot be specified. Moreover, in the technology described in Patent Literature 2, since attention is paid only to the contents of work by a worker irrespective of the product to be worked, it is impossible to specify what operation by the worker is the factor of the quality of each product. This causes a problem that the factor of the product quality cannot be specified in detail.

Therefore, an object of the present invention is to provide a manufacturing management method in which the problem described above, that is, a problem that it is impossible to specify the factor of the product quality in detail, can be solved.

A manufacturing management method, according to one aspect of the present invention, is configured to include
  acquiring unique information of a product from a captured image of the product captured in a manufacturing step included in a manufacturing process of the product, and acquiring operation information representing an operation of a person who performs a manufacturing work on the product in the manufacturing step;
  storing the acquired unique information of the product and the acquired operation information in association with each other;
  when evaluating the product, acquiring the unique information of the product from the captured image of the product, and reading out the operation information stored in association with unique information that is identical to the acquired unique information; and
  specifying a work operation of a person corresponding to the evaluation of the product, on the basis of the readout operation information.

Further, a manufacturing management method, according to one aspect of the present invention, is configured to include
  acquiring unique information of a product from a captured image of the product captured in a manufacturing step included in a manufacturing process of the product, and acquiring operation information representing an operation of a person who performs a manufacturing work on the product in the manufacturing step; and
  storing the acquired unique information of the product and the acquired operation information in association with each other.

Further, a manufacturing management device, according to one aspect of the present invention, is configured to include an acquisition unit that acquires unique information of a product from a captured image of the product captured in a manufacturing step included in a manufacturing process of the product, and acquires operation information representing an operation of a person who performs a manufacturing work on the product in the manufacturing step, and an association unit that stores the acquired unique information of the product and the acquired operation information in association with each other.

Further, a program, according to one aspect of the present invention, is configured to cause an information processing device to realize an acquisition unit that acquires unique information of a product from a captured image of the product captured in a manufacturing step included in a manufacturing process of the product, and acquires operation information representing an operation of a person who performs a manufacturing work on the product in the manufacturing step, and an association unit that stores the acquired unique information of the product and the acquired operation information in association with each other.

Since the present invention is configured as described above, it is possible to specify the factor of the product quality in detail.

BRIEF DESCRIPTION OF DRAWINGS

FIG. 3 illustrates an example of information stored in the step data storage unit disclosed in FIG. 2.

FIG. 4 illustrates an example of information stored in the operation data storage unit disclosed in FIG. 2.

FIG. 5 illustrates an example of information stored in the evaluation data storage unit disclosed in FIG. 2.

FIG. 6A illustrates an example of information stored in the evaluation data storage unit disclosed in FIG. 2.

FIG. 6B illustrates an example of information stored in the evaluation data storage unit disclosed in FIG. 2.

FIG. 14 is a block diagram illustrating a configuration of a manufacturing system according to a second exemplary embodiment of the present invention.

FIG. 15 illustrates an example of information stored in an operation data storage unit of the management device disclosed in FIG. 14.

EXEMPLARY EMBODIMENTS

First Exemplary Embodiment

A first exemplary embodiment of the present invention will be described with reference to FIGS. 1 to 13. FIGS. 1 to 8 are diagrams for explaining a configuration of a manufacturing system, and FIGS. 9 to 13 are illustrations for explaining the processing operation of the management device.

[Configuration]

Figure 7:
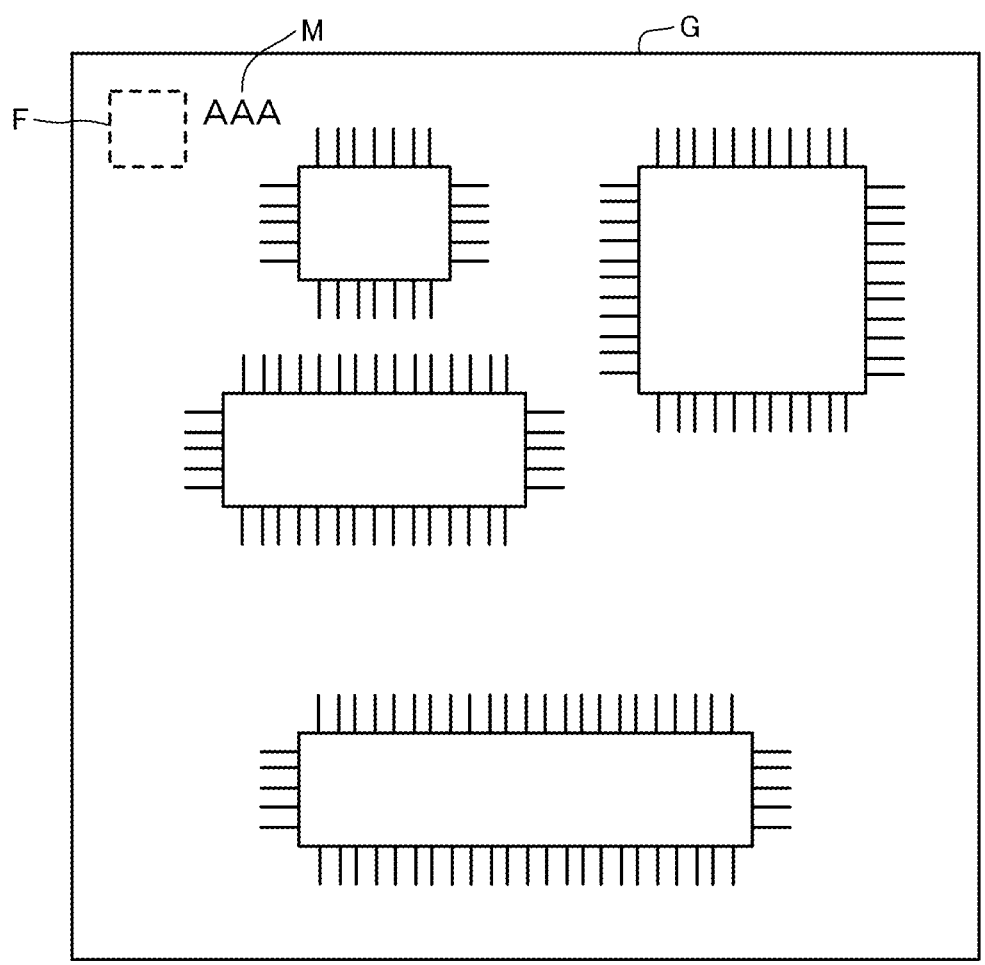
FIG. 7 illustrates an example of a product manufactured in the manufacturing system disclosed in FIG. 1.

The manufacturing system of the present invention is constructed at a manufacturing premise of the manufacturing industry, and manufactures a given product G through the manufacturing process having been set. For example, it is assumed that the product G to be manufactured by the manufacturing system of the present embodiment is a semiconductor substrate as illustrated in FIG. 7. However, the product G to be manufactured by the manufacturing system of the present invention is not limited to a semiconductor substrate, and may be any product. Examples of the product G include electronic devices such as a laptop computer and a smartphone, household appliances such as a refrigerator and a cleaner, automobiles, batteries, tablet and packed medicines, ferrous materials, plastic materials, and the like.

Figure 1:
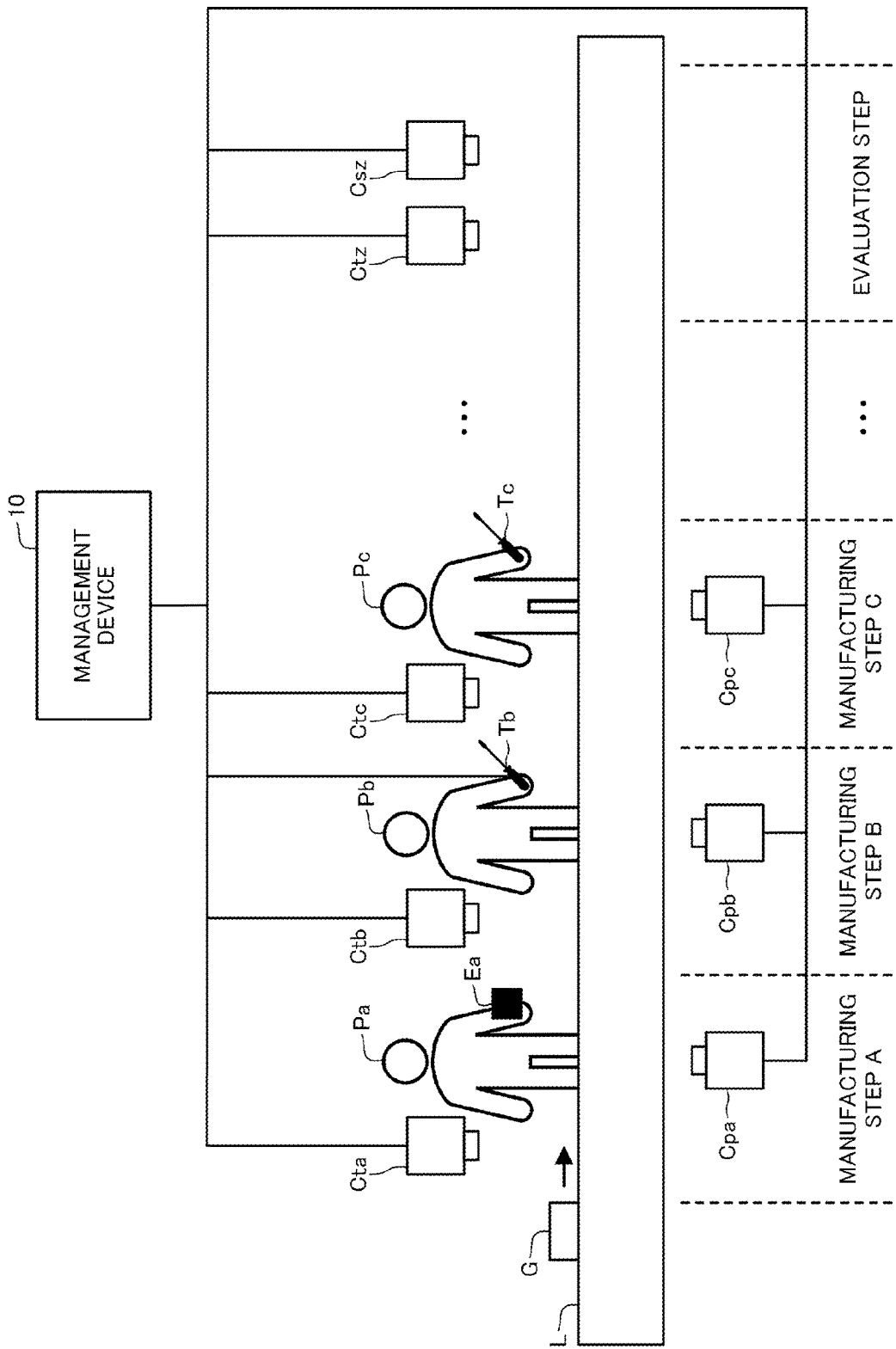
FIG. 1 is a block diagram illustrating a configuration of a manufacturing system according to a first exemplary embodiment of the present invention.

The manufacturing process of manufacturing the product G in the manufacturing system includes a plurality of manufacturing steps. For example, as illustrated in FIG. 1, a manufacturing line L set in the manufacturing system includes a plurality of manufacturing steps A, B, and C, and also includes an evaluation step of evaluating the quality of the finished product G. In the manufacturing steps A, B, and C, manufacturing work for manufacturing the product G is performed. For example, in the manufacturing step A, work of mounting a given component Ea to the product G by a worker Pa is performed (operation a), in the manufacturing step B, a joining process using a tool T with respect to the product G by a worker Pb is performed (operation b), and in the manufacturing step C, assembling work using a tool Tc with respect to the product G by a worker Pc is performed (operation c). Further, in the evaluation step, quality evaluation through image processing of an image in which the product G is captured is performed. Note that the contents of work in the respective steps as described above performed in the manufacturing line L are examples. For example, any manufacturing work may be performed by a worker such as medicine injection work and stirring work in the case of producing chemical products such as pharmaceutical products. Further, the manufacturing line L may include only one manufacturing step or a larger number of manufacturing steps, without being limited to the number of manufacturing steps described above.

The manufacturing system of the present invention has, particularly for quality management of the product G, a function of identifying each product G conveyed through the manufacturing line and storing operation information of a worker (person) representing the manufacturing state of each product G in each manufacturing step. Therefore, it is indispensable to use the technology for identifying each product G. In the present embodiment, an object fingerprint authentication technology for performing individual identification using a fine pattern (object fingerprint) on a surface of the product G is used.

Here, an object fingerprint authentication technology will be briefly described. In general, industrial products of the same specification are manufactured using manufacturing devices of the same specification so as not to have variations. However, even in mechanical components applied with cutting processing with high accuracy and components manufactured from the same mold, when the surfaces of the products are enlarged using a microscope under a specific illumination condition, the pieces of unevenness on the surfaces slightly differ from each other individually, which can be observed as different patterns. Such a fine pattern is of a level unrelated to the performance and the quality of a product and a component, and each has unique different feature. Therefore, the individual difference can be recognized by an image. That is, like a living thing, an industrial product also has a unique fingerprint individually, and it is possible to perform individual identification using such an object fingerprint.

Specifically, when an object fingerprint is extracted from a product, for example, a surface of a product is captured under a specific illumination condition, and from the captured image, a location where a change in the luminance is steep and the position is stably obtained is determined as a feature point. Then, by putting a local luminance pattern around the feature point into data as a feature amount, it is extracted as an object fingerprint of the product. Then, in the case of collating object fingerprints for checking whether or not they are identical products, it is performed by verifying consistency in the geometric arrangement of the feature points. For example, from the object fingerprints to be collated with each other, feature points in which the difference between the feature amounts becomes minimum is obtained as a pair, and from the obtained pair groups, only pair groups in which a relative positioning relationship with another feature point does not contradict are extracted. Then, a collation score S=ninlier/Ntotoal is calculated, where Ntotoal represents the number of extracted feature points, and ninlier represents the number of feature point pairs in which the geometric arrangement is correct. When the collation score is higher than a given threshold, it can be determined that the product from which the collated object fingerprint is extracted is an identical individual. Note that the object fingerprint extraction method and the collation method described above are just examples, and any methods may be used.

Next, the configuration of the manufacturing system will be further described. In the manufacturing steps A, B, and C and the evaluation step, the manufacturing system has cameras Cta, Ctb, Ctc, and Ctz for capturing an object fingerprint that is unique information of the product G. Each of the cameras Cta, Ctb, Ctc, and Ctz is installed so as to capture a partial surface for extracting the object fingerprint of the product G under a specific illumination condition, and transmits a captured tracking image to the management device 10. For example, in the present embodiment, each of the cameras Cta, Ctb, Ctc, and Ctz is installed to capture at least an image near the corner of a position where a specific mark M is located, among the four corners of a semiconductor substrate that is the product G illustrated in FIG. 7.

Further, in each of the manufacturing steps A, B, and C, the manufacturing system has a manufacturing state acquisition device that acquires information serving as the basis for acquiring operation data (operation information) representing the work operation of each of the workers Pa, Pb, and Pc in each of the manufacturing steps. Upon acquiring information serving as the basis for the parameter representing the operation data in each manufacturing step, the manufacturing state acquisition device transmits the information to the management device 10. For example, in the manufacturing step A, in order to acquire "component name" and "mounting direction" of the component to be mounted at the time of component mounting that is operation data of the worker Pa, the camera Cpa for capturing the working state including the worker Pa is provided as a manufacturing state acquisition device, and acquires a moving image at the time of working. Further, in the manufacturing step B, in order to acquire the "working time" at the time of joining work that is operation data of the worker Pa, a sensor for measuring the operation time of a tool Tb is built in the tool Tb to be used by the worker Pc, which is provided as a manufacturing state acquisition device to acquire the working time. Note that in the manufacturing step B, the camera Cpb for capturing the working state including the worker Pb is also provided to acquire a moving image at the time of working. Further, in the manufacturing step C, in order to acquire "tool name" to be used for assembling work that is operation data of the worker Pc, the camera Cpc for capturing the working state including the worker Pc is provided as a manufacturing state acquisition device, and acquires a moving image at the time of working.

In the manufacturing system, in the evaluation step, a camera Csz for capturing the entire product G is provided so as to evaluate the quality of the manufactured product G. The camera Csz is installed to capture the entire product G so as to be able to detect information for evaluating the quality such as whether or not there is a crack in the product G, and transmits a captured image for evaluation to the management device 10.

The pieces of operation data representing the work operations of the workers Pa, Pb, and Pc acquired in the manufacturing steps A, B, and C are not limited to those described above, and may be any data if it is data resulting from operations of the workers Pa, Pb, and Pc. Accordingly, the information serving as the basis for acquiring the operation data of the manufacturing steps A, B, and C is not limited to the moving images of the workers and the measurement values measured by the sensor of the tool as described above, and may be still images of the workers or any information acquired by other sensors. Further, the evaluation step is not limited to performing quality evaluation of the product G on the basis of images for evaluation. For example, quality evaluation using heat distribution by thermography and quality evaluation by visual inspection by a worker may be performed, and such an evaluation result may be input to the management device 10.

Figure 2:
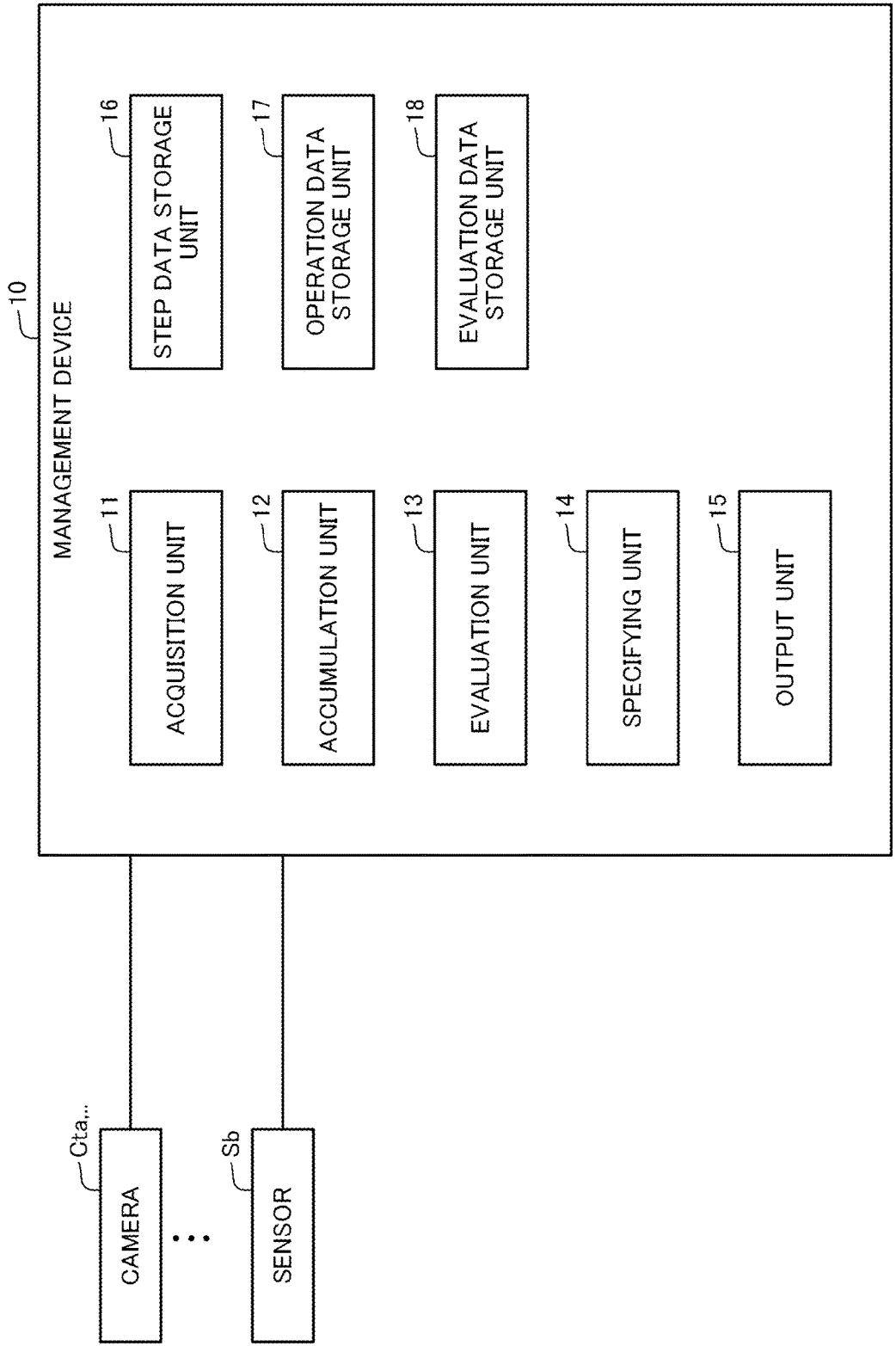
FIG. 2 is a block diagram illustrating a configuration of the management device disclosed in FIG. 1.

As illustrated in FIG. 1, the manufacturing system also has the management device 10. The management device 10 is configured of one or a plurality of information processing devices each having an arithmetic unit and a storage unit. As illustrated in FIG. 2, the management device 10 includes an acquisition unit 11, an accumulation unit 12, an evaluation unit 13, a specifying unit 14, and an output unit 15 that are constructed by execution of a program by the arithmetic unit. The management device 10 also includes a step data storage unit 16, an operation data storage unit 17, and an evaluation data storage unit 18 that are formed in the storage unit. Hereinafter, each configuration will be described in detail.

The acquisition unit 11 acquires tracking images captured by the cameras Cta, Ctb, and Ctc provided to the manufacturing steps A, B, and C respectively, and extracts and acquires the object fingerprint that is unique information of the product G from each of the tracking images. In the present embodiment, first, from a tracking image in which at least a part of a surface of the product G is captured, the acquisition unit 11 specifies an area near the corner where a specific mark M is positioned, among the four corners of a semiconductor substrate that is the product G, as an object fingerprint area F. Specifically, the acquisition unit 11 detects the specific mark M from the tracking image in which the product G is shown as illustrated in FIG. 7, and specifies an area of the position separated by a specific distance from the edge forming the corner where the mark M is positioned, as the object fingerprint area F. Then, the acquisition unit 11 puts the pattern of the specified object fingerprint area F into data as a feature amount, and extracts it as the object fingerprint of the product G. Thereby, the object fingerprint can be extracted from the identical locations on the surface of the product G captured in the manufacturing steps A, B, and C.

The acquisition unit 11 also acquires moving images at the time of working of the workers from the cameras Cpa, Cpb, and Cpc and the tool Tb provided as manufacturing state acquisition devices in the manufacturing steps A, B, and C, and measurement values from the sensor built in the tool Tb, and acquires operation data representing the operations of the workers in the manufacturing steps A, B, and C from the moving images and the measurement values. At that time, as illustrated in FIG. 3, the acquisition unit 11 acquires the operation data in the manufacturing steps on the basis of a correspondence table of the manufacturing steps and the operation data previously stored in the step data storage unit 16.

Specifically, since the acquisition unit 11 is provided so as to acquire "component name" and "mounting direction" of a component to be mounted on the product G as operation data, from the moving image acquired from the camera Cpa provided in the manufacturing step A, the component name and the mounting direction of the component that is held by a hand of the worker Pa and mounted on the product G in the manufacturing step A are specified. At that time, in the management device 10, the shape information of the component and the component name are previously registered in association with each other, and the component name can be specified by collating the registered component shape information and the shape of a component Ea shown in the image acquired from the camera Cpa. Further, the acquisition unit 11 extracts a moving locus of the hand of the worker Pa from the moving image to thereby be able to specify the information of the mounting direction of the component (for example, from left side or right side of the worker). Note that the acquisition unit 11 is not necessarily limited to acquire the component name and the mounting direction by the method described above. It may acquire the component name and the mounting direction by any methods.

In the case of the manufacturing step B, since the acquisition unit 11 is provided to acquire "working time" of the joining work using the tool Tb with respect to the product G as the operation data, the acquisition unit 11 acquires the working time by measuring it with the sensor built in the tool Tb provided to the manufacturing step B. Note that the acquisition unit 11 is not necessarily limited to acquire the working time by the method described above. It may acquire the working time by any methods. For example, the acquisition unit 11 may analyze the moving image captured by the camera Cpb provided to the manufacturing step B and extracts the operation of the joining work by the worker Pb, to thereby acquire the working time by measuring the time in which such an operation is performed.

In the case of the manufacturing step C, since the acquisition unit 11 is provided so as to acquire "tool" used for the assembling work of the product G as operation data, from the moving image acquired from the camera Cpc provided to the manufacturing step C, the tool name of the tool that is held by the hand of the worker Pc in the manufacturing step C is specified. Here, in the management device 10, the shape information of the tool and the tool name are previously registered in association with each other, and the tool name can be specified by collating the registered tool shape information and the shape of the tool Tc shown in the image acquired from the camera Cpa. Note that the acquisition unit 11 is not necessarily limited to acquire the tool name by the method described above. It may acquire the tool name by any methods. For example, in the manufacturing step C, it is defined to store each tool in the designated place for each tool, and by providing a mounting sensor at the storing place of each tool, a tool taken out from the storing place by the worker Pc may be detected and the tool name used for the assembling work may be specified.

Note that the operation data acquired in the manufacturing steps A, B, and C by the acquisition unit 11 is not limited to that described above, and may be any operation data. For example, operation data acquired by the acquisition unit 11 may include operation during working, a line of sight, posture, how to hold a tool, and the like of a worker. As another example, in the case where the product G is a chemical product such as a pharmaceutical, as operation data, the filling amount in a drug filling operation may be acquired from a sensor built in a filling device, and a drug stirring work operation by a worker may be extracted from a moving image to acquire the working time thereof.

The accumulation unit 12 (association unit) stores the object fingerprint of the product G acquired by the acquisition unit 11 described above and the operation data representing the operation of the worker performed on the product G in the operation data storage unit 17, in association with each other. Here, the accumulation unit 12 stores the object fingerprint and the operation data acquired in the same manufacturing step, in association with each other. That is, the accumulation unit 12 associates the object fingerprint and the operation data acquired by the acquisition unit 11 as described above at almost the same timing. Further, when the object fingerprints of the product G acquired in different manufacturing steps match, the accumulation unit 12 collectively store the pieces of operation data acquired in the respective manufacturing steps in association with one object fingerprint. Thereby, the pieces of operation data in the respective manufacturing steps of the same product G can be collectively stored in association with one object fingerprint. At that time, the accumulation unit 12 also store the moving images of the work operations of the workers Pa, Pb, and Pc in the manufacturing steps A, B, and C in association with the operation data of the respective manufacturing steps.

Specifically, the accumulation unit 12 acquires an object fingerprint and operation data from the acquisition unit 11, and when an object fingerprint that is identical to such an object fingerprint is not stored in the operation data storage unit 17, gives a new individual number, and associates the object fingerprint and the operation data with the individual number and stores them. Meanwhile, when an object fingerprint that is identical to the acquired object fingerprint is stored in the operation data storage unit 17, the accumulation unit 12 stores the operation data by additionally associating it with the individual number associated with the stored object fingerprint. Thereby, as illustrated in FIG. 4, one individual number is given to one object fingerprint, and further, operation data of each working step is stored in association therewith. In the example of FIG. 4, moving images are also stored in association with the operation data The evaluation unit 13 acquires a tracking image captured by the camera Ctz provided to the evaluation step, and extracts and acquires the object fingerprint that is unique information of the product G from the tracking image. The method of extracting the object fingerprint is similar to the method of extraction by the acquisition unit 11 as described above. Then, the evaluation unit 13 checks whether or not an object fingerprint identical to the object fingerprint acquired from the product G in the evaluation step is stored in the operation data storage unit 17. When an object fingerprint identical to the object fingerprint acquired from the product G in the evaluation step is stored in the operation data storage unit 17, the evaluation unit 13 reads the individual number given to the identical object fingerprint, and specifies it as the individual number of the product G in the evaluation step.

Figure 5:
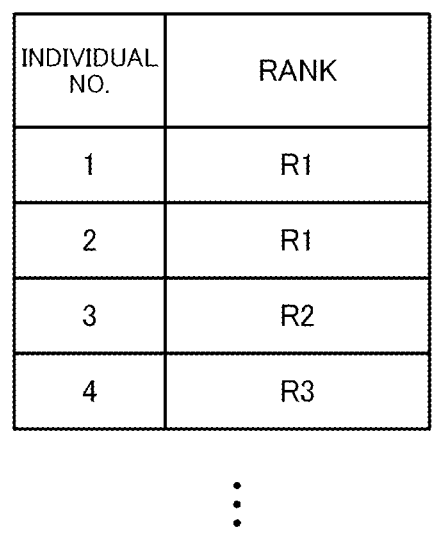
Figure 8:
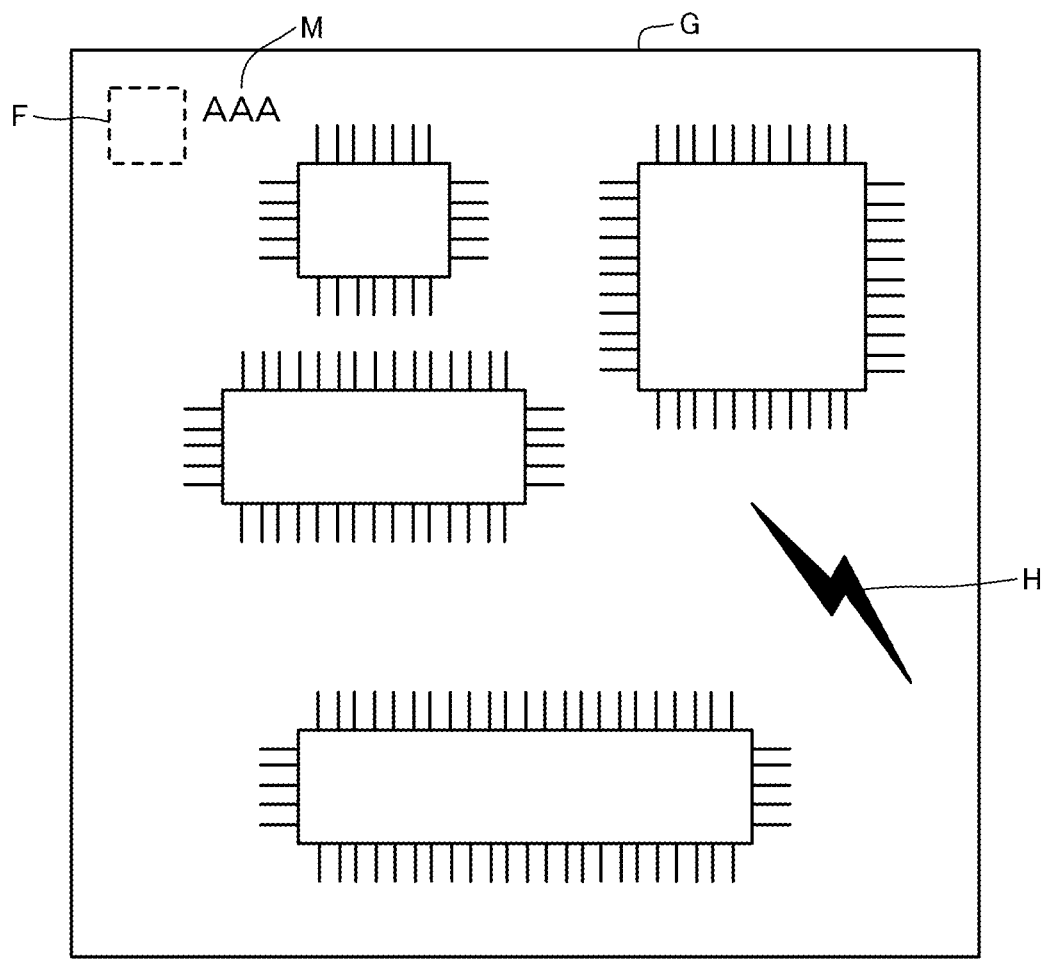
FIG. 8 illustrates an example of a product manufactured in the manufacturing system disclosed in FIG. 1.
Figure 9:
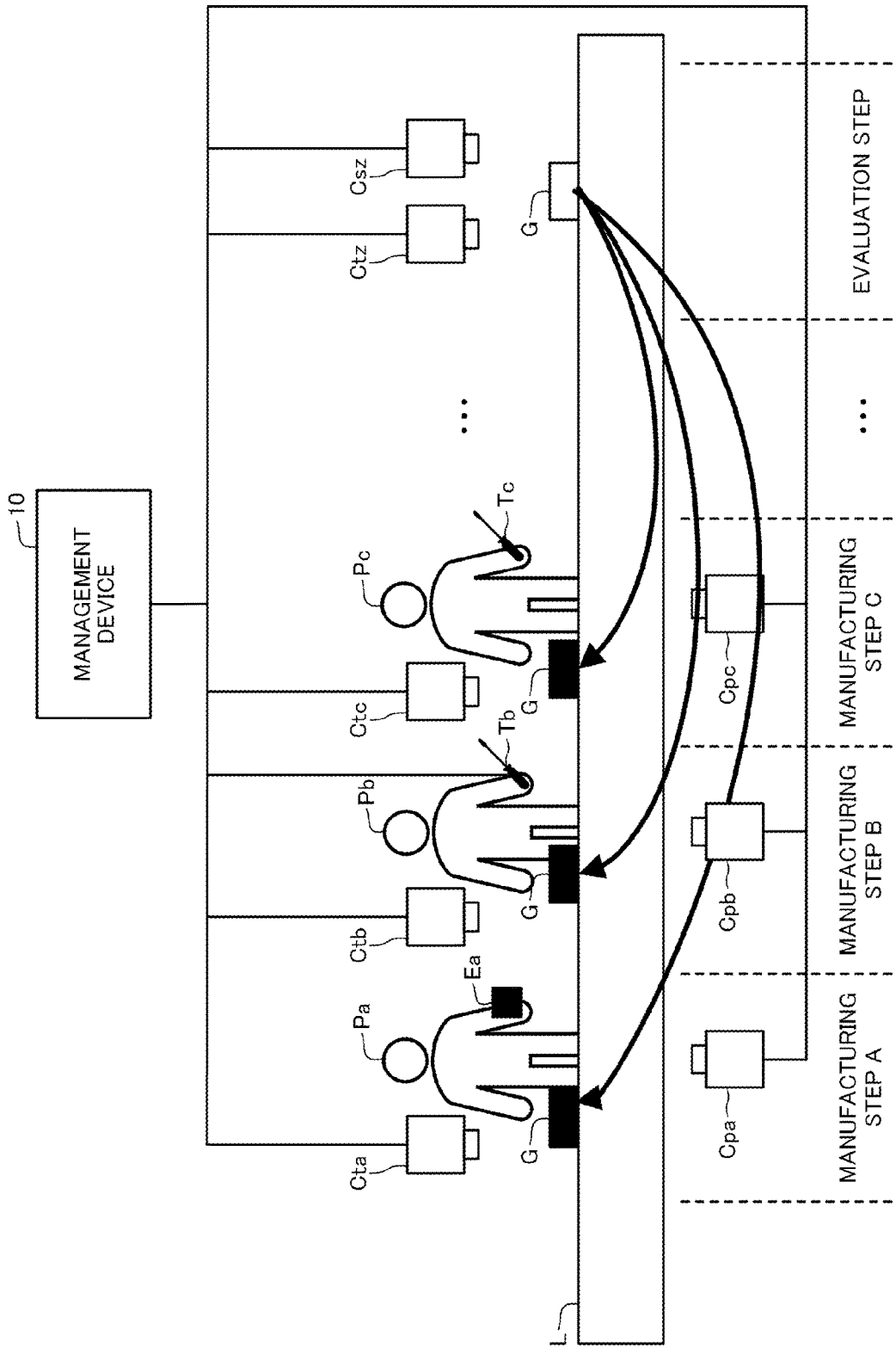
FIG. 9 is a diagram for explaining an operation of the management device disclosed in FIG. 1.

Further, the evaluation unit 13 acquires an evaluation image showing the entire product G captured by the camera Csz for evaluation provided to the evaluation step, and analyzes the evaluation image to evaluate the quality of the product G. For example, as illustrated in FIG. 8, the evaluation unit 13 detects a crack H in the product G and detects the length, width, position, and the like of the crack H from the evaluation image to thereby evaluate the quality of the product G in a plurality of levels. Then, the evaluation unit 13 stores the evaluation result in the evaluation data storage unit 18 while associating it with the individual number specified from the object fingerprint acquired at almost the same timing as the evaluation image used for quality evaluation. For example, as illustrated in FIG. 5, the evaluation unit 13 ranks the evaluation of the product G in a plurality of levels such as R1, R2, and R3, and stores it in the evaluation data storage unit 18 in association with the individual number. In that case, it is assumed that evaluation is higher as the numerical value of the rank is smaller, and evaluation is lower as the numerical value of the rank is larger. For example, in the present embodiment, it is assumed that ranks R1 and R2 represent quality of a normal condition and rank R3 represents quality of an abnormal condition. Note that the evaluation unit 13 is not necessarily perform evaluation of the product G in a plurality of levels. The evaluation unit 13 may evaluate the quality of the product G by detecting the product G in a specific state such as only detecting that the product G is in an abnormal condition.

Then, since the evaluation of the product G is associated with the individual number as described above, from the individual number, the evaluation unit 13 can read the operation data representing the work operations of the workers in the manufacturing step of the product G from the operation data storage unit 17. For example, as illustrated in FIG. 5, it is assumed that an object fingerprint identical to the object fingerprint of the product G evaluated as rank R3, that is, in an abnormal condition, is registered with the individual number "4". In that case, the evaluation unit 13 reads information of the individual number "4" from the operation data storage unit 17 as illustrated in the lower stage of FIG. 6A. As described above, by reading out the information of the product G from the operation data storage unit 17, as indicated by the arrows in FIG. 9, it is possible to retroactively specify the operation data representing the work operations of the workers in the respective manufacturing steps A, B, and C of the product G evaluated as an abnormal condition in the evaluation step.

In the present embodiment, while the evaluation unit 13 evaluates the quality of the product G from the evaluation image in which the product G is captured, evaluation may be performed by any methods such as quality evaluation using heat distribution by thermography. Further, without being limited to automatic evaluation of the quality of the product G through image processing, the evaluation unit 13 may receive an input of an evaluation result manually performed such as visual observation by a worker in the evaluation step.

The evaluation unit 13 also reads out operation data representing the work operations by the workers in the respective manufacturing steps of the product G, for each evaluation of the product G. For example, as illustrated in FIG. 6A, the evaluation unit 13 reads out the operation data of individual numbers corresponding to the product G of the ranks R1 and R2 evaluated as normal, and operation data of an individual number corresponding to the product G of the rank R3 evaluated as abnormal, separately, and stores them in the evaluation data storage unit 18. Thereby, it is possible to compare the operation data during the manufacturing steps of the product G evaluated as normal with the operation data during the manufacturing steps of the product G evaluated as abnormal, and recognize the difference between them.

The specifying unit 14 specifies a work operation of a worker that is a factor of evaluation of the product G, on the basis of the evaluation of the product G by the evaluation unit 13 as described above, and the operation data representing the work operation of the workers in the manufacturing steps of the product G. In the present embodiment, the specifying unit 14 specifies a correlation between the content of evaluation of the product G and the operation data of each of the manufacturing steps, on the basis of the operation data of each evaluation of the product G illustrated in FIG. 6A that is read and stored in the evaluation data storage unit 18 by the evaluation unit 13. As an example, the operation data of the individual numbers corresponding to the product G of the ranks R1 and R2 evaluated as normal illustrated in the upper part of FIG. 6A is compared with the operation data of the individual numbers corresponding to the product G of the rank R3 evaluated as abnormal illustrated in the lower part of FIG. 6A, separately, and stores them in the evaluation data storage unit 18. Here, as indicated by reference signs Y1 and Y2 in FIG. 6B, when there is a difference in the "working time" that is operation data of the manufacturing step B, it is specified that operation data of the "working time" has a correlation with the evaluation of the product G. That is, it is specified that the factor of the product G being abnormal is the "working time" of the joining work in the manufacturing step B.

Further, the specifying unit 14 may specify the value of operation data having a correlation, for each evaluation of the product G. For example, from the "working time" in the manufacturing step B of the rank R3 specified as operation data having a correlation with the evaluation of abnormality, the specifying unit 14 may specify the value of "working time" (for example, "12 seconds or more") of the joining work with respect to the product G in the manufacturing step B that may cause an abnormality. Further, from the "working time" in the manufacturing step B of the rank R1 evaluated as best quality in the normal condition, the specifying unit 14 may specify the value of "working time" (for example, "10 seconds") of the joining work with respect to the product G in the manufacturing step that may lead to the best quality. Then, the specifying unit 14 stores the operation data having a correlation with evaluation of the product G specified as described above and the value of the operation data corresponding to the evaluation, in the evaluation data storage unit 18.

In the above description, the case where the specifying unit 14 specifies that the operation data having a correlation with the evaluation of the product G is "working time" in the manufacturing step B has been described as an example. However, there is a case where another parameter in another manufacturing step is specified, of course. For example, there is a case where the operation data having a correlation with evaluation of the product G being abnormal is specified to be "component name" in the manufacturing step A, or a case where it is specified to be "tool name" in the manufacturing step C. Moreover, the specifying unit 14 may specify two or more types of operation data as operation data having a correlation with evaluation of the product G.

The output unit 15 outputs, from an output device such as a display device, operation data in each of the manufacturing steps of the product G read by the evaluation unit 13 or operation data having a correlation with evaluation of the product G specified by the specifying unit 14. In particular, the output unit 15 generates operation assistance information for assisting the work operation for a worker on the basis of the operation data corresponding to each evaluation of the product G, and outputs such operation assistance information to the worker.

Figure 10A:
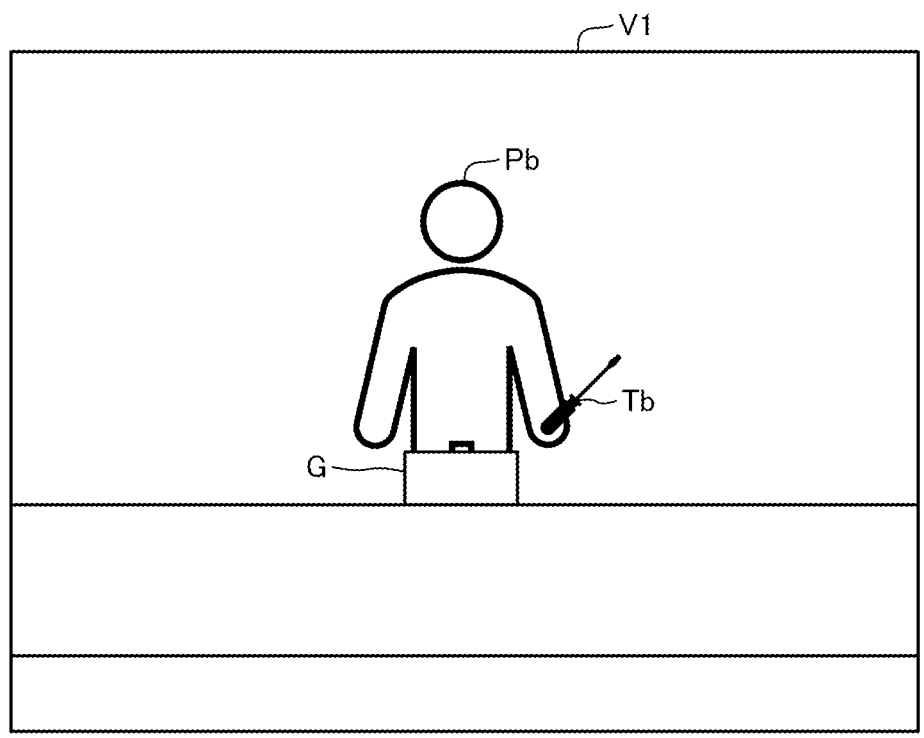
FIG. 10A is an illustration for explaining an operation of the management device disclosed in FIG. 1.
Figure 10B:
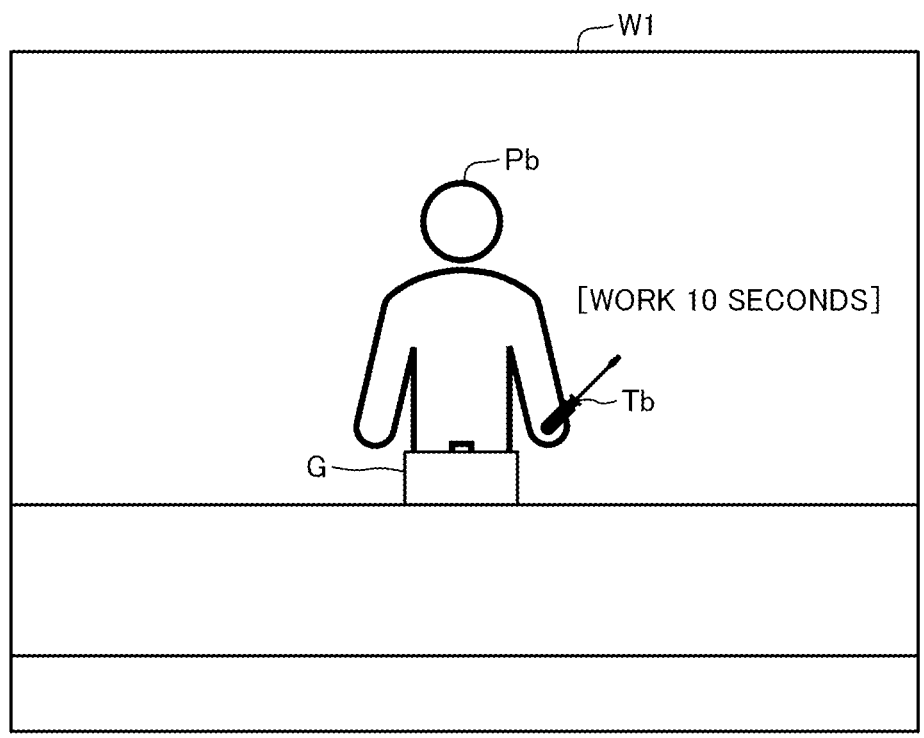
FIG. 10B is an illustration for explaining an operation of the management device disclosed in FIG. 1.

Here, an example of generating operation assistance information by the output unit 15 will be described. First, as an example, it is assumed that the factor of the evaluation of the product G being in an abnormal condition is the case where "working time" of the joining work with respect to the product G in the manufacturing step B is "12 seconds or more", and that "working time" of the joining work with respect to the product G in the manufacturing step B that may lead to the best quality in the normal condition is "10 seconds", as described above. Here, as illustrated in FIG. 10A, it is assumed that a moving image V1 at the time of work operation specified as being in an abnormal condition by the worker Pb in the manufacturing step B is acquired, and the moving image V1 is stored in the operation data storage unit 17 in association with the operation data as illustrated in FIG. 4. In that case, the output unit 15 generates operation assistance information using the moving image V1 at the time of work operation in the manufacturing step B specified as abnormal, and "10 seconds" that is the "working time" of the joining work with respect to the product G in the manufacturing step B that may lead to the best quality in the normal condition. Specifically, the output unit 15 generates text information of "work 10 seconds" from "10 seconds" that is the "working time" of the joining work with respect to the product G in the manufacturing step B that may lead to the best quality in the normal condition and, as illustrated in FIG. 10B, generates a new moving image in which such text information is superimposed on the moving image V1 captured in the manufacturing step B that is specified as being in an abnormal condition, as operation assistance information W1. Then, the output unit 15 outputs the operation assistance information W1 configured of the generated moving image so as to be accessible by the worker Pb.

As described above, since the output unit 15 generates the operation assistance information W1 and outputs it to the worker Pb, the worker Pb can recognize the own work operation that causes the product G to be in an abnormal condition and also recognize correct operation.

Note that the output unit 15 is not necessarily limited to generate operation assistance information as described above. For example, the output unit 15 may use the moving image V1 in the manufacturing step B in which the product G of the worker Pb becomes an abnormal condition as operation assistance information as it is, or use only "12 seconds" that is the value of "working time" of the joining work with respect to the product G that is operation data when the product G become an abnormal condition, and output it to the worker Pb as operation assistance information with respect to the work operation that may cause the product G to be in an abnormal condition. Alternatively, the output unit 15 may output only "10 seconds" that is the value of "working time" of the joining work with respect to the product G that is operation data when the product G becomes the best quality in the normal condition, as operation assistance information to the worker Pb. Further, the output unit 15 may compare the operation data of the working step that is the factor of the abnormal condition with the work operation manual having been set in advance, extract part of the work operation manual corresponding to the operation data of the working step that is the factor of the abnormal condition, and output the extracted part of the manual to the worker Pb as operation assistance information.

Figure 11A:
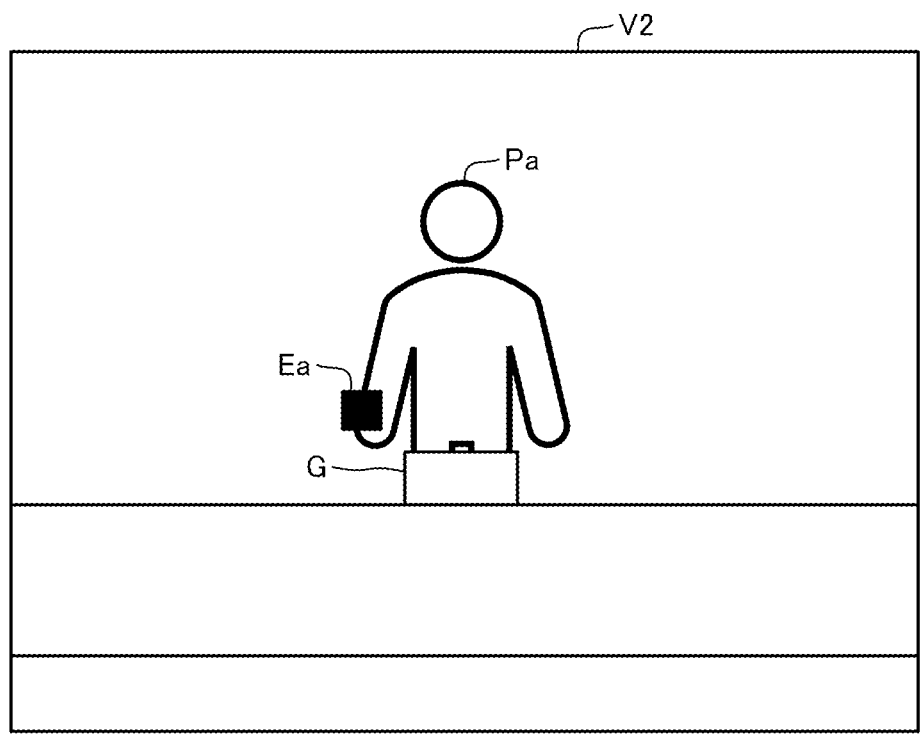
FIG. 11A is an illustration for explaining an operation of the management device disclosed in FIG. 1.
Figure 11B:
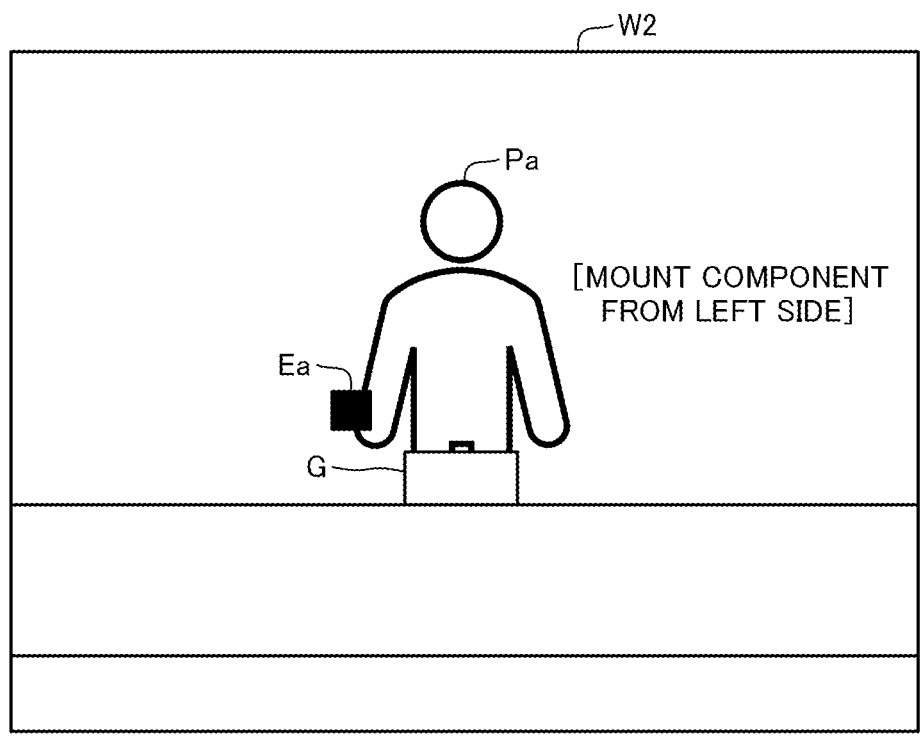
FIG. 11B is an illustration for explaining an operation of the management device disclosed in FIG. 1.

Another example of generating operation assistance information by the output unit 15 will be described. Here, it is assumed to be specified that the factor of evaluation that the product G is in an abnormal condition is that "mounting direction" of the product G in the manufacturing step A is "from right side", and the "mounting direction" of the product G in the manufacturing step A that may lead to the best quality in the normal condition is "from left side". Here, as illustrated in FIG. 11A, it is assumed that a moving image V2 at the time of work operation specified to be in an abnormal condition by the worker Pa in the manufacturing step A is acquired, and the moving image V2 is stored in the operation data storage unit 17 in association with the operation data. In that case, the output unit 15 generates operation assistance information using the moving image V2 at the time of work operation specified to be in an abnormal condition, and "from left side" that is the value of the mounting direction of the component with respect to the product G in the manufacturing step A that may lead to the best quality in the normal condition. Specifically, the output unit 15 generates text information of "mounting the component from left side" using "from left side" that is the value of the mounting direction of the component with respect to the product G in the manufacturing step A that may lead to the best quality in the normal condition and, as illustrated in FIG. 11B, generates a new moving image in which such text information is superimposed on the moving image V2 in the manufacturing step A specified to be in an abnormal condition, as operation assistance information W2. Then, the output unit 15 outs the operation assistance information W2 configured of the generated moving image so as to be accessible by the worker Pa.

[Operation]

Figure 12:
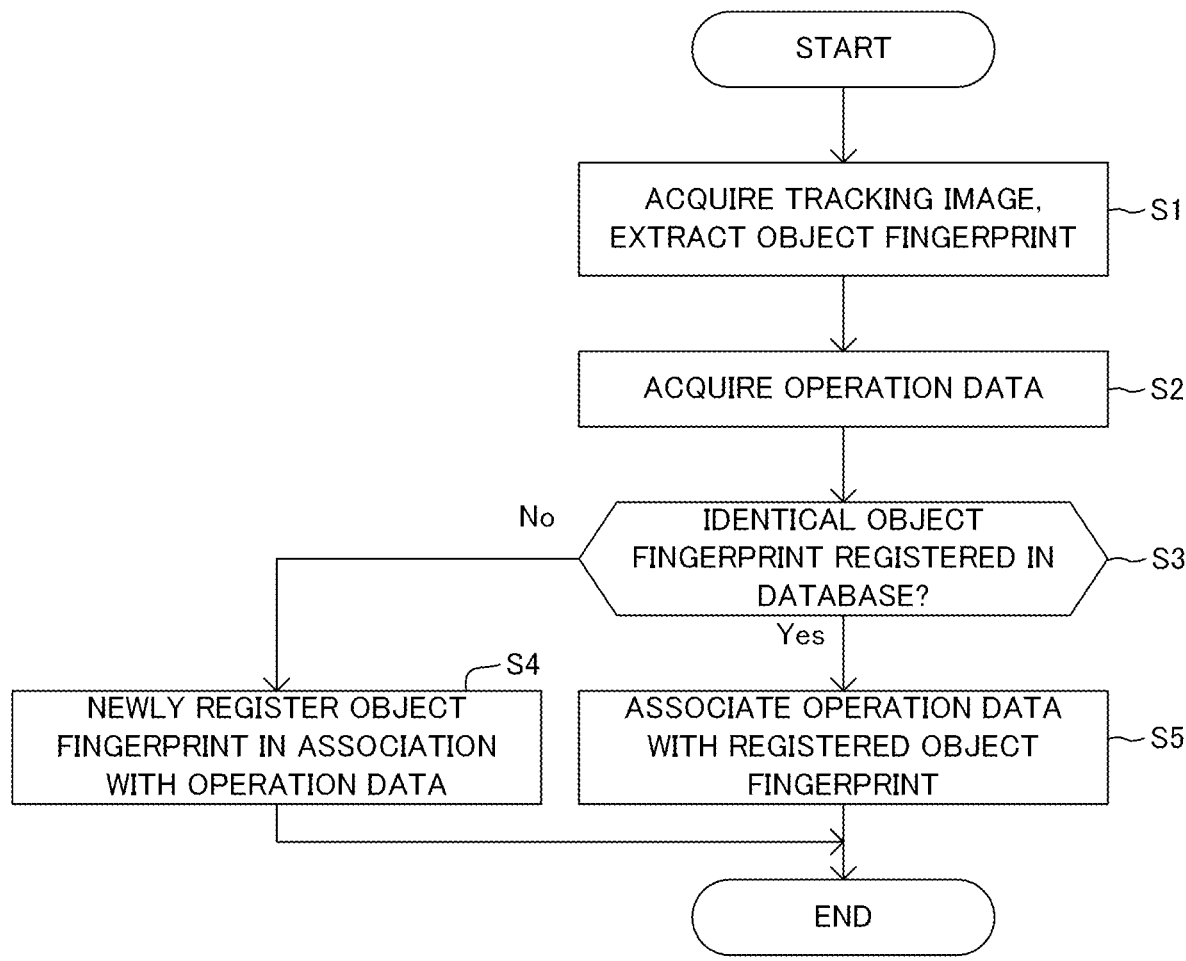
FIG. 12 is a flowchart illustrating an operation of the management device disclosed in FIG. 1.
Figure 13:
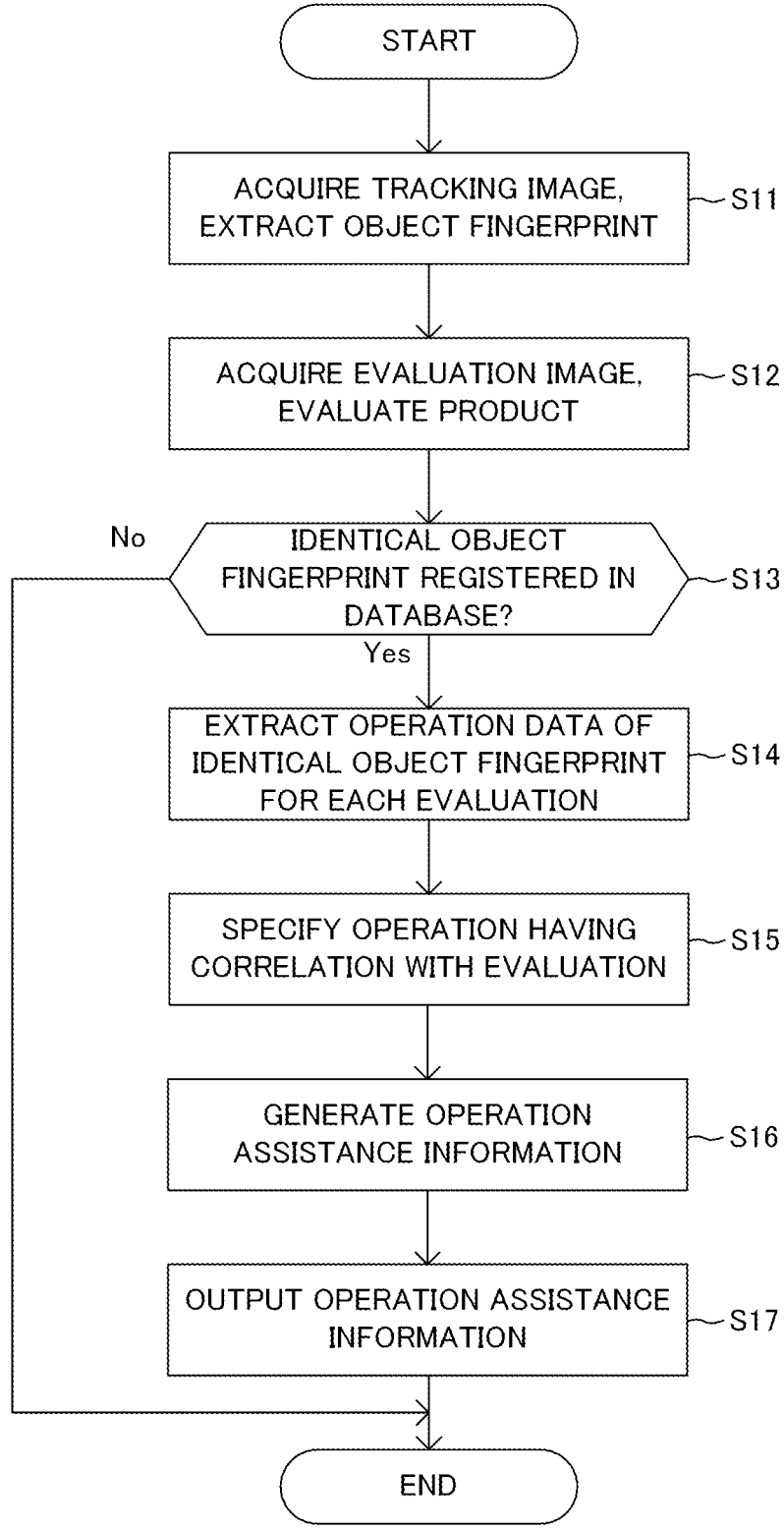
FIG. 13 is a flowchart illustrating an operation of the management device disclosed in FIG. 1.

Next, operation of the management device 10 as described above will be described with reference to the flowcharts of FIGS. 12 and 13 mainly. First, with reference to the flowchart of FIG. 12, description will be given on an operation of accumulating operation data representing work operations of the workers in the manufacturing steps of the product G manufactured in the manufacturing line L.

The management device 10 first acquires a tracking image captured by the camera Cta provided to the manufacturing step A that is the first manufacturing step. Then, the management device 10 extracts and acquires an object fingerprint that is unique information of the product G from the tacking image acquired in the manufacturing step A (step S1). At the almost same timing, the management device 10 acquires a manufacturing state image from the camera Cpa provided as a manufacturing state acquisition device in the manufacturing step A. Then, from the moving image that is the manufacturing state image acquired in the manufacturing step A, the management device 10 acquires "component name" and "mounting direction" that are operation data representing the work operation by the worker Pa in the manufacturing step A (step S2).

Then, the management device 10 checks whether or not an object fingerprint identical to the object fingerprint of the product G acquired in the manufacturing step A has been stored in the operation data storage unit 17 (step S3). At this point of time, since the manufacturing step A is the first manufacturing step for the product G, the object fingerprint of the product G is not stored in the operation data storage unit 17 (No at step S3). Therefore, the management device 10 newly registers the object fingerprint of the product G acquired in the manufacturing step A, and assigns a new individual number to the object fingerprint. Further, the management device 10 associates the newly assigned individual number with the object fingerprint and the "component name" and the "mounting direction" that are operation data acquired in the manufacturing step A, and stores them in the operation data storage unit 17 (step S4). At that time, the management device 10 also associates the moving image in which the work operation of the worker Pa is captured in the manufacturing step A together with the operation data, and stores it in the operation data storage unit 17.

Then, it is assumed that the product G in which the manufacturing work has been completed in the manufacturing step A as described above proceeds to the manufacturing step B that is the next manufacturing step. In this step, the management device 10 first acquires a tracking image captured by the camera Ctb provided to the manufacturing step B. Then, the management device 10 extracts and acquires an object fingerprint that is unique information of the product G from the tacking image acquired in the manufacturing step B (step S1). At the almost same timing, the management device 10 acquires "working time" that is operation data representing the work operation of the worker Pb in the manufacturing step B, from a sensor built in the tool Tb provided as a manufacturing state acquisition device in the manufacturing step B. At that time, the management device 10 also acquires a moving image in which the work operation of the worker Pb in the manufacturing step B is captured at almost the same timing.

Then, the management device 10 checks whether or not an object fingerprint identical to the object fingerprint of the product G acquired in the manufacturing step B has been stored in the operation data storage unit 17 (step S3). Here, since the manufacturing step A has been completed for the product G, the object fingerprint of the product G has been stored in the operation data storage unit 17 (Yes at step S3). Therefore, the management device 10 associates "working time" that is the operation data acquired in the manufacturing step B with the individual number assigned to the object fingerprint that is identical to the object fingerprint of the product G acquired in the manufacturing step B, and stores it in the operation data storage unit 17 (step S5). Thereby, the pieces of operation data acquired in the manufacturing step A and the manufacturing step B respectively are associated with the object fingerprint of the product G. At that time, the management device 10 also associates the moving image in which the work operation of the worker Pb is captured in the manufacturing step B together with the operation data and stores it in the operation data storage unit 17.

Then, it is assumed that the product G in which the manufacturing work has been completed in the manufacturing step B proceeds to the manufacturing step C that is the next manufacturing step. In this step, the management device 10 acquires a tracking image captured by the camera Ctc provided to the manufacturing step C. Then, the management device 10 extracts and acquires an object fingerprint that is unique information of the product G from the tacking image acquired in the manufacturing step C (step S1). At the almost same timing, the management device 10 acquires a moving image that is a manufacturing state image from the camera Cpc provided as a manufacturing state acquisition device in the manufacturing step C. Then, from the moving image acquired in the manufacturing step C, the management device 10 acquires "tool name" that is operation data representing the work operation in the manufacturing step C (step S2).

Then, the management device 10 checks whether or not an object fingerprint identical to the object fingerprint of the product G acquired in the manufacturing step C has been stored in the operation data storage unit 17 (step S3). Here, since the manufacturing steps A and B have been completed for the product G, the object fingerprint of the product G has been stored in the operation data storage unit 17 (Yes at step S3). Therefore, the management device 10 associates the "tool name" that is the operation data acquired in the manufacturing step C with the individual number assigned to the object fingerprint that is identical to the object fingerprint of the product G acquired in the manufacturing step C, and stores it in the operation data storage unit 17 (step S5). Thereby, the pieces of operation data acquired in the manufacturing steps A, B, and C respectively are associated with the object fingerprint of the product G. At that time, the management device 10 also associates the moving image in which the work operation of the worker Pc is captured in the manufacturing step C together with the operation data and stores it in the operation data storage unit 17.

If there is another manufacturing step thereafter, the management device 10 stores the operation data and the moving image acquired in each manufacturing step in association with the individual number of the object fingerprint that is identical to the object fingerprint acquired in each manufacturing step. Thereby, as illustrated in FIG. 4 for example, the operation data and the moving image of each manufacturing step are associated with the individual number of each product G specified by the object fingerprint, and are accumulated in the operation data storage unit 17.

Next, an operation when the product G proceeds to the evaluation step will be described with reference to the flowchart of FIG. 13. The management device 10 acquires a tracking image captured by the camera Ctz provided to the evaluation step. Then, the management device 10 extracts and acquires an object fingerprint that is unique information of the product G, from the tacking image acquired in the evaluation step (step S11).

Further, at almost the same timing, the management device 10 acquires an evaluation image showing the entire product G captured by the camera Csz for evaluation provided to the evaluation step, and analyzes the evaluation image to evaluate the quality of the product G (step S12). For example, as illustrated in FIG. 8, the evaluation unit 13 detects a crack H caused in the product G and detects the length, width, position, and the like of the crack H from the evaluation image to thereby evaluate the quality of the product G in a plurality of levels, and ranks it as illustrated in FIG. 5.

Then, the management device 10 checks whether or not an object fingerprint identical to the object fingerprint of the product G acquired in the evaluation step has been stored in the operation data storage unit 17 (step S13). Here, since the manufacturing steps have been completed for the product G, the object fingerprint of the product G has been stored in the operation data storage unit 17 (Yes at step S13). Then, the management device 10 reads, from the operation data storage unit 17, the operation data representing the work operations in the manufacturing steps and the moving images associated with the individual number assigned to the object fingerprint that is identical to the object fingerprint of the product G acquired in the evaluation step (step S14). Note that the management device 10 may read only the operation data of the product G whose quality is currently evaluated in the evaluation step from the operation data storage unit 17. Thereby, operation data in each manufacturing step of the product G that is evaluated that an abnormal condition has occurred in the evaluation step can be checked.

Further, as illustrated in FIG. 6A, for each evaluation of the product G, the management device 10 reads the operation data representing the work operations in the manufacturing steps of the product G from the operation data storage unit 17 (step S14). Then, with use of the readout operation data for each evaluation of the product G, the management device 10 specifies the work operation including the operation data, the manufacturing step, and the moving image that is the factor of the evaluation of the product G (step S15). For example, the management device 10 compares the operation data of a product G group that is evaluated to be in a normal condition with the operation data of a product G group that is evaluated to be in an abnormal condition, and specify the correlation between the content of evaluation of the product G and the operation data of each manufacturing step, as indicated by the reference signs Y1 and Y2 of FIG. 6B. Then, the management device 10 stores the operation data specified to have a correlation with the content of evaluation in the evaluation data storage unit 18, and outputs it.

Further, the management device 10 generates the operation assistance information for assisting the work operation of the workers on the basis of the operation data in which a correlation with the evaluation of the product G is specified (step S16). For example, as illustrated in FIGS. 10B and 11B, with respect to the moving image of the work step in which the product G is evaluated to be in an abnormal condition, the management device 10 generates the operation assistance information W1 and W2 including the operation data in the working step in which the product is evaluated to be in a normal condition (for example, information such as the working time being "10 seconds" and the working direction being "from left side") and text information configured of operation data included in a preset manual. Then, the management device 10 outputs the generated operation assistance information so as to be accessible by the workers (step S17).

As described above, in the present embodiment, for each manufacturing step of the product G, the object fingerprint that is unique information of the product G and the operation data representing the work operations by the workers in the manufacturing steps are acquired, and the object fingerprint and the operation data acquired in the same manufacturing step are stored in association with each other. Therefore, the pieces of operation data in the manufacturing steps of the same product G can be collectively stored in association.

Then, in the present embodiment, the object fingerprint of the product G is acquired even in the evaluation step of the product G. Thereby, with use of such an object fingerprint, by reading out the operation data at the time of each manufacturing step of the product G stored in association with the identical object fingerprint, it is possible to check the operation data of each manufacturing step corresponding to the evaluation of the product retroactively.

Further, in the present embodiment, through comparison between pieces of operation data at the time of each manufacturing step of the products G having different evaluation, a correlation between the evaluation of the product G and the operation data is specified. Thereby, it is possible to specify the factor in the manufacturing steps of the quality of the product G in detail. Then, on the basis of the specified factor, by generating and outputting the operation assistance information for the workers, it is possible to allow the workers to recognize the own work operation that causes the product G to be in an abnormal condition, and to improve the quality of the product.

Note that while an object fingerprint is used as unique information of the product G, it is not necessarily limited to use an object fingerprint as unique information. For example, in the case where it is easy to assign identification information such as a barcode to the product G, it is possible to extract identification information such as a barcode from an image in which the product G is captured and use it as unique information.

Second Exemplary Embodiment

Figure 16A:
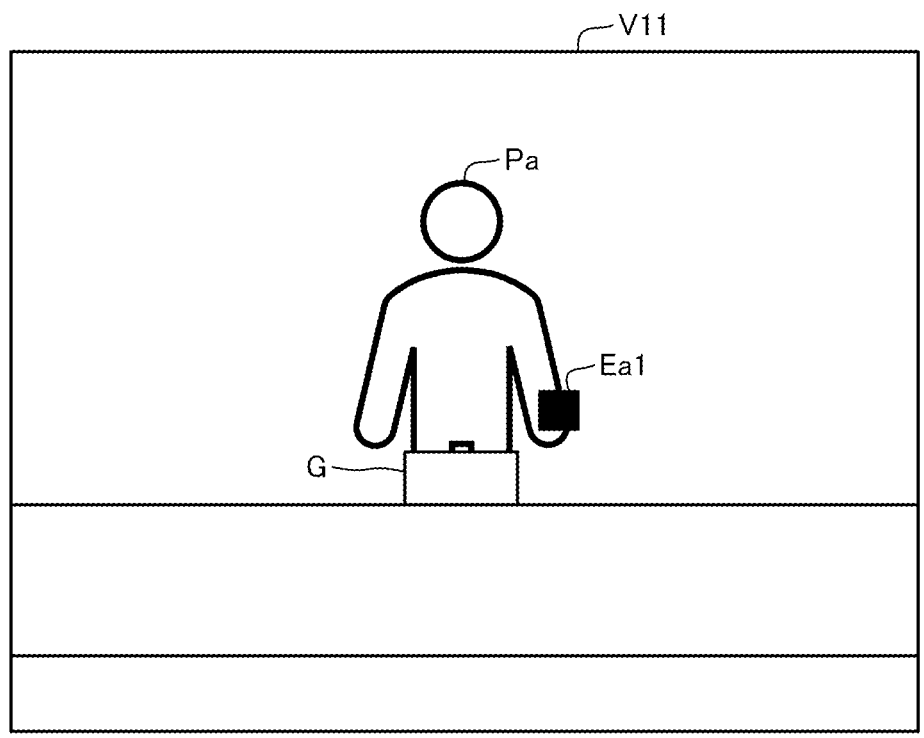
FIG. 16A illustrates an example of processing by the management device disclosed in FIG. 14.

Next, a second exemplary embodiment of the present invention will be described with reference to FIGS. 14 to 16. A manufacturing system of the present embodiment further includes the configuration provided below, in addition to the manufacturing system described in the first exemplary embodiment. In the below description, a configuration different from that of the first exemplary embodiment will be mainly described.

As illustrated in FIG. 14, the manufacturing system of the present embodiment includes the manufacturing steps A, B, and C, and displays Da, Db, and Dc that are display devices for displaying and outputting work assistance information to the workers Pa, Pb, and Pc respectively. The displays D1, Db, and Dc are provided so as to allow the workers Pa, Pb, and PC in the respective manufacturing steps A, B, and C to visually recognize the display screens during the manufacturing works.

Then, the output unit 15 of the present embodiment outputs the operation assistance information generated in the first exemplary embodiment and illustrated in FIG. 10B or 11B to display it on the display of the corresponding manufacturing step. For example, as illustrated in FIG. 11B having been described in the first exemplary embodiment, when the operation assistance information W1 in the manufacturing step B is generated, the output unit 15 outputs the operation assistance information W1 to always display it on the display Db provided to the manufacturing step B. Thereby, the worker Pb of the manufacturing step B can perform the manufacturing work in the manufacturing step B while watching the operation assistance information W1. This prompts a correct work operation and can improve the quality of the product G.

Further, the output unit 15 of the present embodiment also has a function of generating operation assistance information as described above and outputting it to the displays Da, Db, and Dc with respect to the manufacturing works that are currently performed by the workers Pa, Pb, and PC in the respective manufacturing steps A, B, and C. The management device 10 also has a function of evaluating the quality of the product G being manufactured currently, during the manufacturing work.

In order to realize the functions described above, first, the specifying unit 14 of the present embodiment specifies a work operation of a worker causing the evaluation of the product G, on the basis of the evaluation of the product G and the operation data representing the work operations of the workers in the manufacturing steps of the product G, similar to the case of the first exemplary embodiment. For example, the operation data of the products G of the ranks R1 and R2 evaluated to be in a normal condition illustrated in the upper part of FIG. 15 is compared with the operation data of the individual numbers corresponding to the products G of the rank R3 evaluated to be in an abnormal condition illustrated in the lower part of FIG. 15. Here, as indicated by reference signs Y11 and Y12 in FIG. 15, when there is a difference in the "component name" that is operation data of the manufacturing step A, it is specified that operation data of the "component name" has a correlation with the evaluation of the product G. That is, it is specified that the factor of the product G being in an abnormal condition is the case where the "component name" of the component mounted on the product G in the manufacturing step A is "Ea2" or the case where it is not "Ea1".

Further, the specifying unit 14 specifies the value of the operation data having a correlation for each evaluation of the product G, and stores it in the evaluation data storage unit 18 as learning data. In the example of FIG. 15, the specifying unit 14 specifies the value of the "component name" (for example, "Ea2") of the component mounted on the product G in the manufacturing step A that may cause an abnormal condition, and also specifies the value of the "component name" (for example, "Ea1") of the component mounted on the product G in the manufacturing step A of the ranks R1 and R2 evaluated to be in a normal condition, and stores them as learning data.

Then, the acquisition unit 11 of the present embodiment acquires the moving image of the worker Pa who is currently performing the work in the manufacturing step A from the camera Cpa provided to the manufacturing step A, and acquires "component name" that is operation data that should be acquired in the manufacturing step A. Here, the acquisition unit 11 specifies the component name by collating the shape information of the component registered in advance and the shape of the component shown in the moving image acquired from the camera Cpa, as described above. Note that the acquisition unit 11 also acquires the object fingerprint of the product G as described above.

Further, the evaluation unit 14 of the present embodiment evaluates the product G being manufactured currently from the "component name" acquired from the current moving image by the acquisition unit 11, using the learning data stored in the evaluation data storage unit 18 as described above. For example, like a moving image V11 illustrated in FIG. 16A, when the component of the acquired "component name (Ea1)" is evaluated to be in a normal condition in the learning data, the evaluation unit 14 evaluates the product G being manufactured currently to be in a normal condition. Meanwhile, like a moving image V12 illustrated in FIG. 16B, when the component of the acquired "component name (Ea2)" is evaluated to be in an abnormal condition in the learning data, the evaluation unit 14 evaluates the product G being manufactured currently to be in an abnormal condition.

Then, the evaluation unit 14 associates the evaluation result of the product G evaluated in the manufacturing step A with the object fingerprint of the product G acquired in the manufacturing step A, and stores them in the evaluation data storage unit 18. For example, in the example described above, the evaluation unit 14 associates the object fingerprint of the product G evaluated to be in an abnormal condition because a component of the "component name (Ea2)" is mounted in the manufacturing step A, with the evaluation of "abnormal condition", and associates the object fingerprint of the product G evaluated to be in a normal condition because a component of the "component name (Ea1)" is mounted, with the evaluation of "normal condition". However, when the work operation of the worker Pa in the manufacturing step A is modified by the output of the operation assistance information and the evaluation of the product G is changed to a normal condition, the evaluation unit 14 also changes the evaluation associated with the object fingerprint of the product G, as described below. Further, the evaluation unit 14 also evaluates the identical product G even in the subsequent manufacturing steps as similar to the above description, during the manufacturing steps. Therefore, even in the case where evaluation of a normal condition is associated with the object fingerprint of a product G, if it is once evaluated to be in an abnormal condition in the subsequent manufacturing steps, the object fingerprint of such product G will be associated with evaluation of an abnormal condition.

Figure 16B:
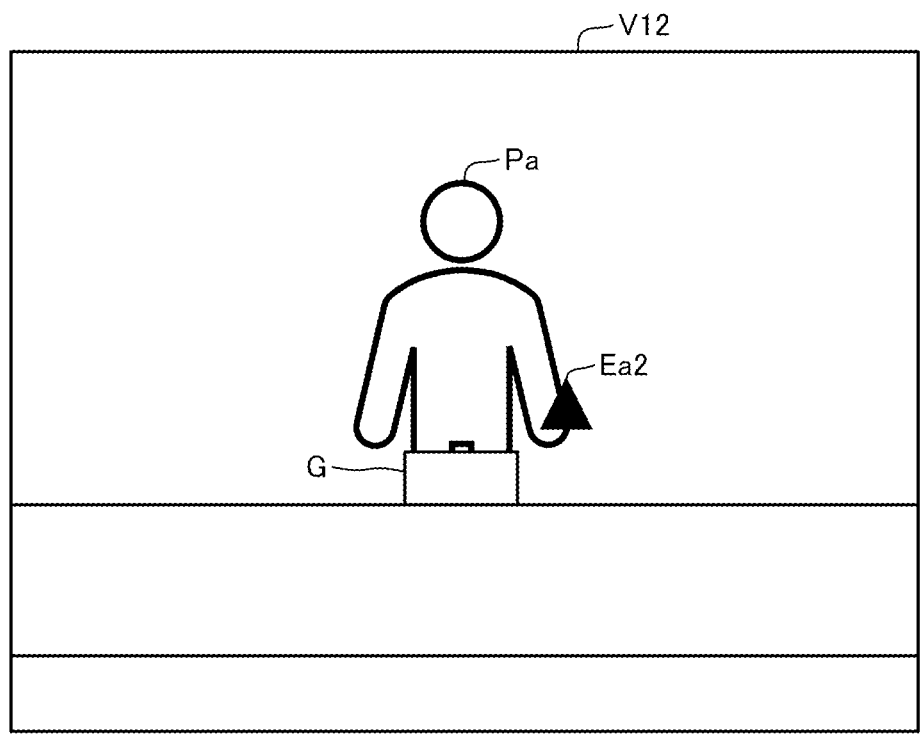
FIG. 16B illustrates an example of processing by the management device disclosed in FIG. 14.
Figure 16C:
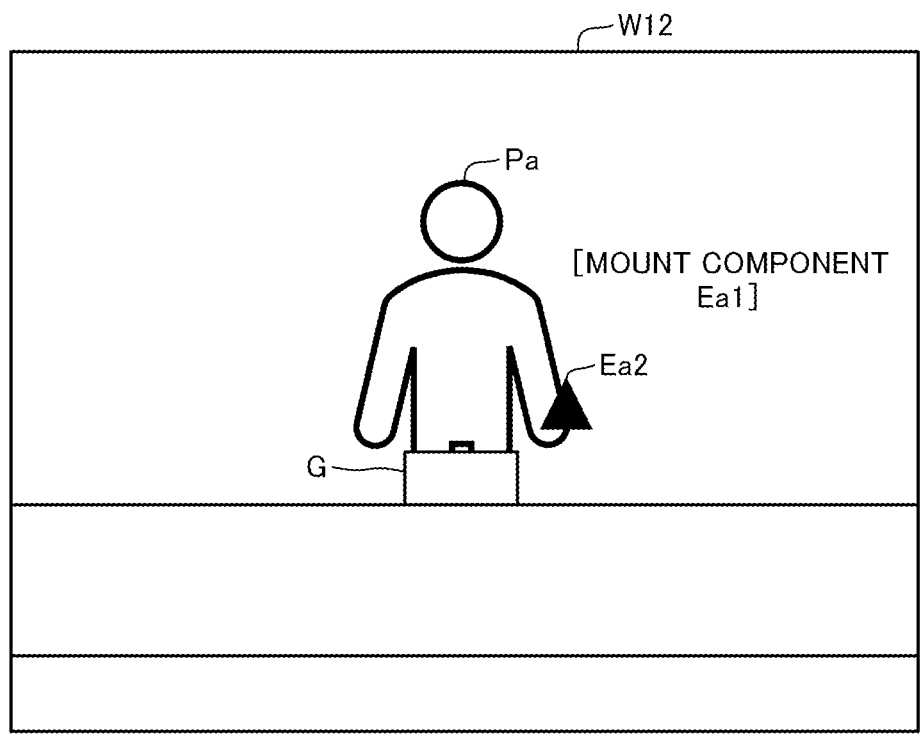
FIG. 16C illustrates an example of processing by the management device disclosed in FIG. 14.

Further, when the product G is evaluated to be in an abnormal condition from the current moving image in any of the manufacturing steps A, B, and C, the output unit 15 in the present embodiment generates operation assistance information on the basis of the operation data acquired from the current moving image and the learning data. For example, it is assumed that the moving image V12 illustrated in FIG. 16B is acquired in the manufacturing step A, and according to the "component name (Ea2)" acquired from the moving image V12, the product G is evaluated to be in an abnormal condition from the learning data. In that case, the output unit 15 extracts the "component name (Ea1)" associated with the evaluation of a normal condition in the manufacturing step A from the learning data, and from such information, generates text information that "mount component Ea1", and generates a new moving image in which the text information is superimposed on the current moving image as operation assistance information W12 as illustrated in FIG. 16C. Then, the output unit 15 outputs the operation assistance information W12 configured of the generated moving image to the display Da of the manufacturing step A.

Thereby, the worker Pa of the manufacturing step A can see the operation assistance information W12 at almost real time during the manufacturing work, and can correct the wrong manufacturing work to the correct work. As a result, the quality of the product G can be improved.

While, in the above description, the quality of the product G is evaluated and the operation assistance information is output during the manufacturing work of the manufacturing step A as an example, they may be performed in another manufacturing step. For example, when the "working time" is acquired as operation data during the manufacturing work of the manufacturing step B and if the working time does not satisfy the "working time" of the case where the product G is evaluated to be in a normal condition, it is possible to generate operation assistance information by superimposing such a fact and the "working time" evaluated to be in a normal condition on the current moving image, and output it from the display.

Further, in the above description, learning data is generated from the quality evaluation result of the past product G and such learning data is used to evaluate the quality of the product G being in the manufacturing work and generate operation assistance information. However, it is also possible to evaluate the quality of the product G being manufactured and generate operation assistance information using preset manual data.

Further, the output unit 15 may generate operation assistance information by superimposing the "component name" acquired as described above from the current moving image on the current moving image, and output it from a display. In that case, the output unit 15 may display the "component name" by superimposing it on the moving image at a position corresponding to the position of the object in which the "component name" is detected in the current moving image. Thereby, the worker can recognize the own working content in detail at almost real time during the manufacturing work, and can easily recognize the mistake.

Third Exemplary Embodiment

Figure 17:
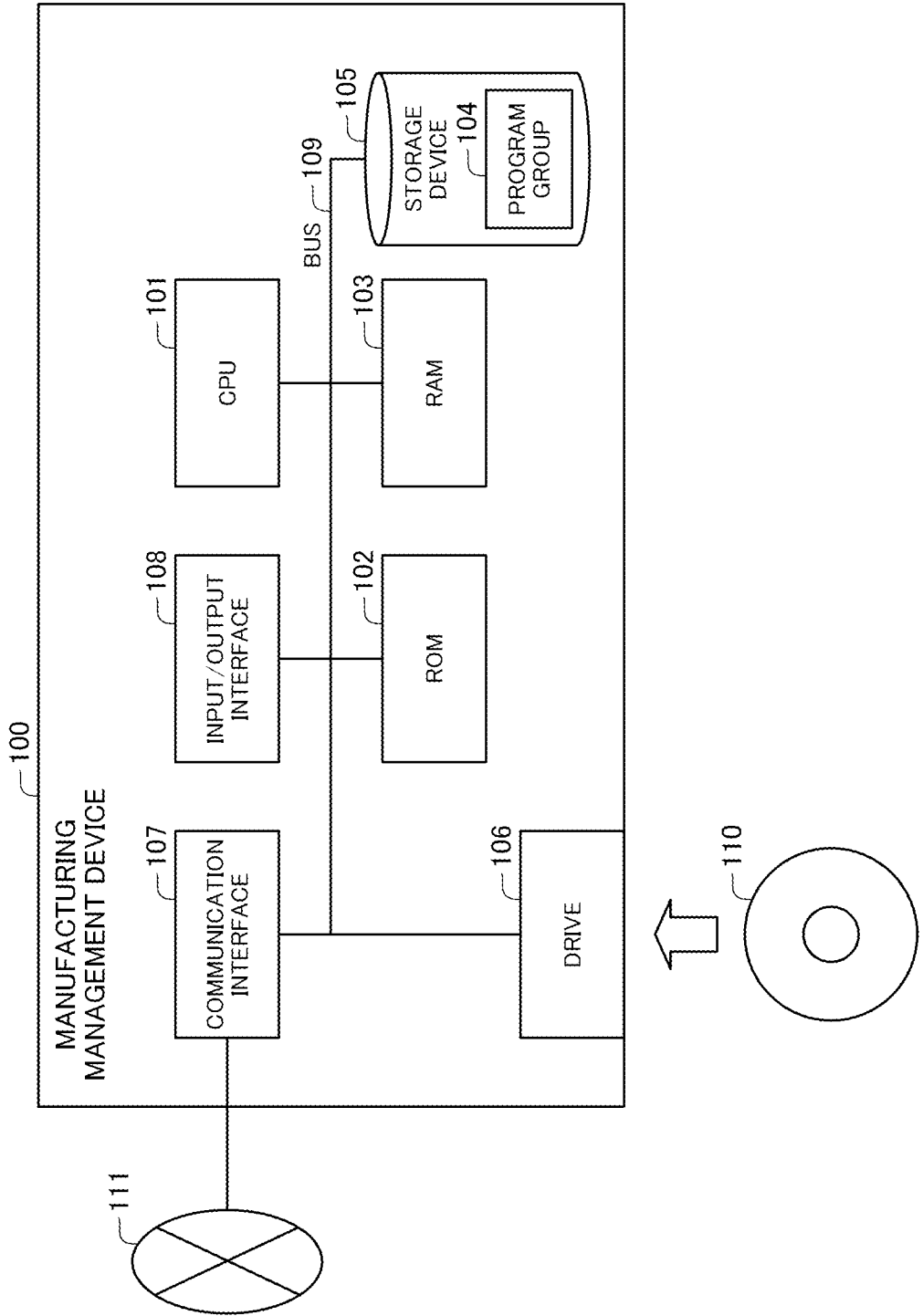
FIG. 17 is a block diagram illustrating a hardware configuration of a manufacturing management device according to a third exemplary embodiment of the present invention.
Figure 18:
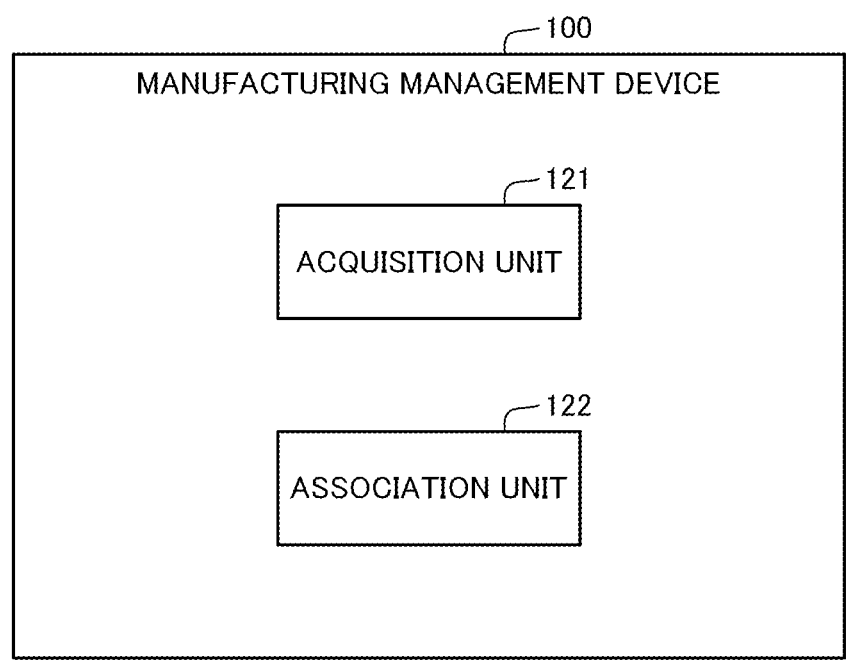
FIG. 18 is a block diagram illustrating a configuration of the manufacturing management device according to the third exemplary embodiment of the present invention.
Figure 19:
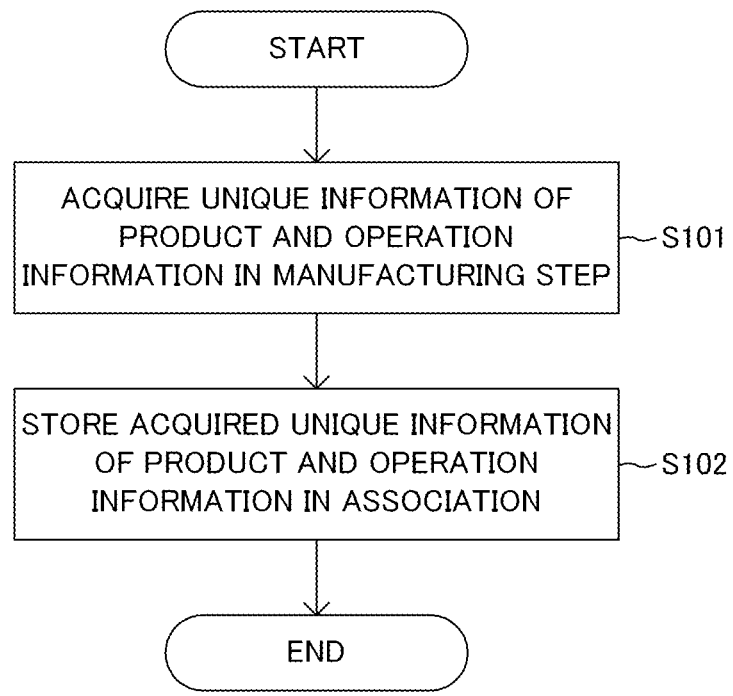
FIG. 19 is a flowchart illustrating an operation of the manufacturing management device according to the third exemplary embodiment of the present invention.
Figure 20:
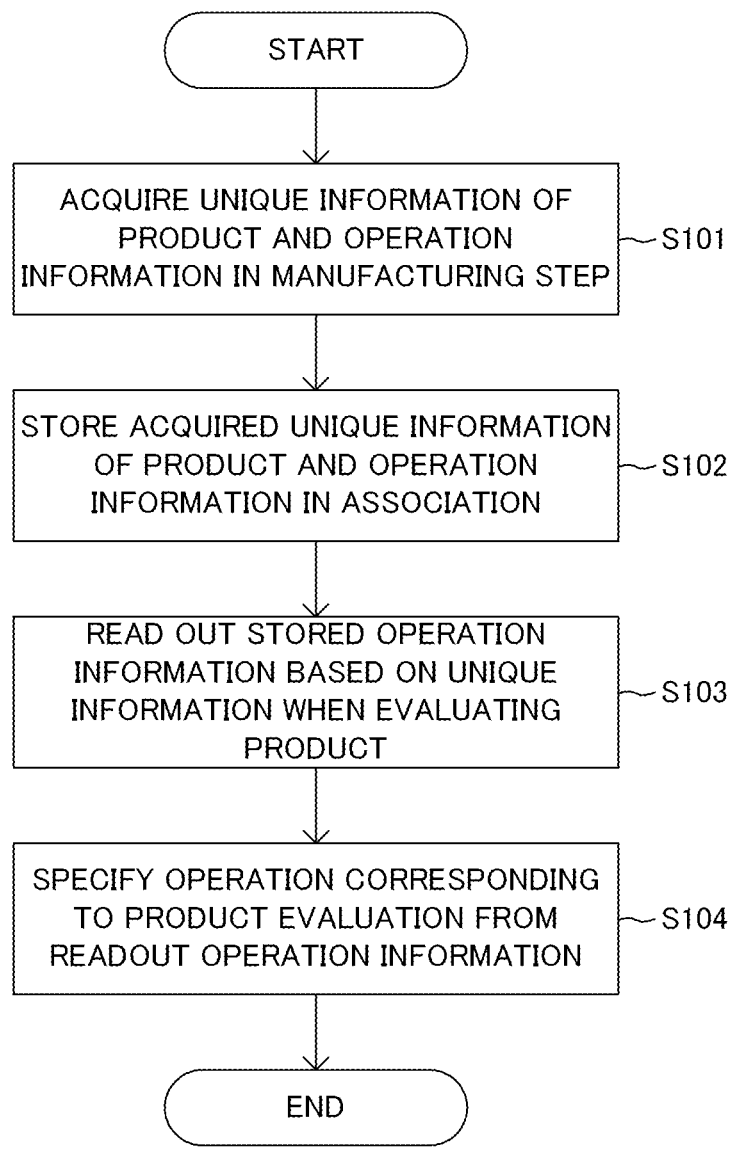
FIG. 20 is a flowchart illustrating an operation of the manufacturing management device according to the third exemplary embodiment of the present invention.

Next, a third exemplary embodiment of the present invention will be described with reference to FIGS. 17 to 20. FIGS. 17 and 18 are block diagrams illustrating the configuration of a manufacturing management device of the third exemplary embodiment, and FIGS. 19 and 20 are flowcharts illustrating the operation of the manufacturing management device. Note that the present embodiment shows the outlines of the management device 10 and the processing method performed by the management device 10 described in the first and second exemplary embodiments.

First, a hardware configuration of the manufacturing management device 100 in the present embodiment will be described with reference to FIG. 17. The manufacturing management device 100 is configured of a typical information processing device, having a hardware configuration as described below as an example.

Central Processing Unit (CPU) 101 (arithmetic unit)
Read Only Memory (ROM) 102 (storage unit)
Random Access Memory (RAM) 103 (storage unit)
Program group 104 to be downloaded to the RAM 103
Storage device 105 storing therein the program group 104
Drive 106 that performs reading and writing on a storage medium 110 outside the information processing device
Communication interface 107 connecting to a communication network 111 outside the information processing device
Input/output interface 108 for performing input/output of data
Bus 109 connecting the constituent elements The manufacturing management device 100 can construct, and can be equipped with, the acquisition unit 121 and the association unit 122 illustrated in FIG. 18 through acquisition and execution of the program group 104 by the CPU 101. Note that the program group 104 is stored in the storage device 105 or the ROM 102 in advance, and is loaded to the RAM 103 by the CPU 101 as needed. Further, the program group 104 may be provided to the CPU 101 via the communication network 111, or may be stored on a storage medium 110 in advance and read out by the drive 106 and supplied to the CPU 101. However, the acquisition unit 121 and the association unit 122 may be constructed by electronic circuits.

Note that FIG. 17 illustrates an example of the hardware configuration of the information processing device that is the manufacturing management device 100. The hardware configuration of the information processing device is not limited to that described above. For example, the information processing device may be configured of part of the configuration described above, such as without the drive 106.

The manufacturing management device 100 executes the manufacturing management method illustrated in the flowchart of FIG. 19 or FIG. 20, by the functions of the acquisition unit 121 and the association unit 122 constructed by the program as described above.

As illustrated in FIG. 19, the manufacturing management device 100
  acquires unique information of a product from a captured image of the product captured in a manufacturing step included in a manufacturing process of the product, and acquires operation information representing an operation of a person who performs a manufacturing work on the product in the manufacturing step (step S101), and
  stores the acquired unique information of the product and the acquired operation information in association with each other (step S102).

Further, as illustrated in FIG. 20, the manufacturing management device 100
  acquires unique information of a product from a captured image of the product captured in a manufacturing step included in a manufacturing process of the product, and acquires operation information representing an operation of a person who performs a manufacturing work on the product in the manufacturing step (step S101),
  stores the acquired unique information of the product and the acquired operation information in association with each other (step S102),
  when evaluating the product, acquires the unique information of the product from the captured image of the product, and reads out the operation information stored in association with unique information that is identical to the acquired unique information (step S103), and
  specifies a work operation of a person corresponding to the evaluation of the product, on the basis of the readout operation information (step S104).

With the configuration described above, the present invention acquires, in the manufacturing step of a product, unique information of the product and operation information representing the operation of a person who performs the manufacturing work in the manufacturing step, and stores them in association with each other. Therefore, the pieces of operation information of the persons in the respective manufacturing steps of the identical product can be collectively stored in association with each other.

Then, at the time of evaluating the product, the present invention acquires the unique information of the product, and with use of such unique information, reads out the operation information at the time of each manufacturing step of the product stored in association with the identical unique information. Thereby, it is possible to check the work operation at the time of each manufacturing step corresponding to the evaluation of the product retroactively.

Further, the present invention specifies a work operation corresponding to the evaluation of the product, on the basis of the readout work operation of each manufacturing step. Thereby, it is possible to specify the factor in the manufacturing steps of the quality of the product in detail.

<Supplementary Notes>

The whole or part of the exemplary embodiments disclosed above can be described as the following supplementary notes. Hereinafter, outlines of the configurations of a manufacturing management method, a manufacturing management device, and a program, according to the present invention, will be described. However, the present invention is not limited to the configurations described below.

(Supplementary Note 1)

A manufacturing management method comprising:

acquiring unique information of a product from a captured image of the product captured in a manufacturing step included in a manufacturing process of the product, and acquiring operation information representing an operation of a person who performs a manufacturing work on the product in the manufacturing step;

storing the acquired unique information of the product and the acquired operation information in association with each other;

when evaluating the product, acquiring the unique information of the product from the captured image of the product, and reading out the operation information stored in association with unique information that is identical to the acquired unique information; and specifying a work operation of a person corresponding to the evaluation of the product, on a basis of the readout operation information.

(Supplementary Note 2)

A manufacturing management method comprising:

acquiring unique information of a product from a captured image of the product captured in a manufacturing step included in a manufacturing process of the product, and acquiring operation information representing an operation of a person who performs a manufacturing work on the product in the manufacturing step; and storing the acquired unique information of the product and the acquired operation information in association with each other.

(Supplementary Note 3)

The manufacturing management method according to supplementary note 2, further comprising when evaluating the product, acquiring the unique information of the product from the captured image of the product, and reading out the operation information stored in association with unique information that is identical to the acquired unique information.

(Supplementary Note 4)

The manufacturing management method according to supplementary note 3, further comprising specifying a work operation of a person corresponding to the evaluation of the product, on the basis of the operation information that is read out when evaluating the product.

(Supplementary Note 5)

The manufacturing management method according to supplementary note 4, further comprising specifying a correlation between a content of the evaluation of the product and the operation information, on a basis of the operation information that is read out when evaluating the product for each product having a different evaluation content.

(Supplementary Note 6)

The manufacturing management method according to supplementary note 4 or 5, further comprising outputting operation assistance information for assisting a work operation of a person, on a basis of the evaluation of the product and the specified work operation of the person corresponding to the evaluation of the product.

(Supplementary Note 7)

The manufacturing management method according to supplementary note 6, further comprising outputting the operation assistance information to the person who performs the manufacturing work on the product in the manufacturing step.

(Supplementary Note 8)

The manufacturing management method according to supplementary note 6 or 7, further comprising acquiring, as the operation information, a person image obtained by capturing the person who performs the manufacturing work on the product in the manufacturing step, and generating the operation assistance information on a basis of the person image and outputting the operation assistance information.

(Supplementary Note 9)

The manufacturing management method according to supplementary note 8, further comprising on a basis of the person image, generating the operation assistance information including text information for supporting the work operation of the person, and outputting the operation assistance information.

(Supplementary Note 10)

The manufacturing management method according to any of supplementary notes 4 to 9, further comprising storing the evaluation of the product and the the specified work operation of the person corresponding to the evaluation of the product, in association with each other; and thereafter, acquiring the unique information of the product from the captured image of the product captured in the manufacturing step, acquiring the operation information of the person who performs the manufacturing work on the product in the manufacturing step, and determining the evaluation of the product stored in association with the work operation of the person corresponding to the acquired operation information, to be evaluation of quality of the product having the acquired unique information.

(Supplementary Note 11)

The manufacturing management method according to any of supplementary notes 1 to 10, further comprising acquiring the unique information of the product from a captured image of the product captured for each manufacturing step, and acquiring the operation information in the manufacturing step;

storing the unique information of the product and the operation information, acquired in an identical manufacturing step, in association with each other;

when evaluating the product, acquiring the unique information of the product from the captured image of the product, and reading out the operation information for each manufacturing step stored in association with unique information that is identical to the acquired unique information; and specifying a work operation of a person corresponding to the evaluation of the product, on a basis of the readout operation information for each manufacturing step.

(Supplementary Note 12)

A manufacturing management device comprising:

an acquisition unit that acquires unique information of a product from a captured image of the product captured in a manufacturing step included in a manufacturing process of the product, and acquires operation information representing an operation of a person who performs a manufacturing work on the product in the manufacturing step, and an association unit that stores the acquired unique information of the product and the acquired operation information in association with each other.

(Supplementary Note 13)

The manufacturing management device according to supplementary note 12, further comprising an evaluation unit that, when evaluating the product, acquires the unique information of the product from the captured image of the product, and reads out the operation information stored in association with unique information that is identical to the acquired unique information.

(Supplementary Note 14)

The manufacturing management device according to supplementary note 13, further comprising a specifying unit that specifies a work operation of a person corresponding to the evaluation of the product, on a basis of the operation information that is read out when the product is evaluated.

(Supplementary Note 15)

The manufacturing management device according to supplementary note 13, wherein the specifying unit specifies a correlation between a content of the evaluation of the product and the operation information, on a basis of the operation information that is read out when the product is evaluated for each product having a different evaluation content.

(Supplementary Note 16)

The manufacturing management device according to supplementary note 14 or 15, further comprising an output unit that outputs operation assistance information for assisting a work operation of a person, on a basis of the evaluation of the product and the specified work operation of the person corresponding to the evaluation of the product.

(Supplementary Note 17)

The manufacturing management device according to supplementary note 16, wherein the output unit outputs the operation assistance information to the person who performs the manufacturing work on the product in the manufacturing step.

(Supplementary Note 18)

The manufacturing management device according to supplementary note 16 or 17, wherein the acquisition unit acquires, as the operation information, a person image obtained by capturing the person who performs the manufacturing work on the product in the manufacturing step, and the output unit generates the operation assistance information on a basis of the person image and outputs the operation assistance information.

(Supplementary Note 19)

The manufacturing management device according to supplementary note 18, wherein the output unit generates the operation assistance information including text information for supporting the work operation of the person on a basis of the person image, and outputs the operation assistance information.

(Supplementary Note 20)

The manufacturing management device according to any of supplementary notes 14 to 19, wherein the identifying unit stores the evaluation of the product and the the specified work operation of the person corresponding to the evaluation of the product, in association with each other, and thereafter, the acquisition unit acquires the unique information of the product from the captured image of the product captured in the manufacturing step, and acquires the operation information of the person who performs the manufacturing work on the product in the manufacturing step, and the evaluation unit determines the evaluation of the product stored in association with the work operation of the person corresponding to the acquired operation information, to be evaluation of quality of the product having the acquired unique information.

(Supplementary Note 20.1)

The manufacturing management device according to any of supplementary notes 12 to 20, wherein the acquisition unit acquires the unique information of the product from a captured image of the product captured for each manufacturing step, and acquires the operation information in the manufacturing step;

the association unit stores the unique information of the product and the operation information, acquired in an identical manufacturing step, in association with each other;

when the evaluation unit evaluates the product, the evaluation unit acquires the unique information of the product from the captured image of the product, and reads out the operation information for each manufacturing step stored in association with unique information that is identical to the acquired unique information; and the specifying unit specifies a work operation of a person corresponding to the evaluation of the product, on a basis of the readout operation information for each manufacturing step.

(Supplementary Note 21)

A program for causing an information processing device to realize:

an acquisition unit that acquires unique information of a product from a captured image of the product captured in a manufacturing step included in a manufacturing process of the product, and acquires operation information representing an operation of a person who performs a manufacturing work on the product in the manufacturing step, and an association unit that stores the acquired unique information of the product and the acquired operation information in association with each other.

(Supplementary Note 21.1)

The program, according to supplementary note 21, for further causing the information processing device to realize
- an evaluation unit that, when evaluating the product, acquires the unique information of the product from the captured image of the product, and reads out the operation information stored in association with unique information that is identical to the acquired unique information.

(Supplementary Note 21.2)

The program, according to supplementary note 21.1, for further causing the information processing device to realize
- a specifying unit that specifies a work operation of a person corresponding to the evaluation of the product, on a basis of the operation information that is read out when the product is evaluated.

Note that the program described above can be supplied to a computer by being stored in a non-transitory computer-readable medium of any type. Non-transitory computer-readable media include tangible storage media of various types. Examples of non-transitory computer-readable media include a magnetic storage medium (for example, flexible disk, magnetic tape, hard disk drive), a magneto-optical storage medium (for example, magneto-optical disk), a CD-ROM (Read Only Memory). a CD-R, a CD-R/W, a semiconductor memory (for example, mask ROM, PROM (Programmable ROM), and EPROM (Erasable PROM), a flash ROM, and a RAM (Random Access Memory)). Note that the program may be supplied to a computer by being stored in a transitory computer-readable medium of any type. Examples of transitory computer-readable media include an electric signal, an optical signal, and an electromagnetic wave. A transitory computer-readable medium can be supplied to a computer via wired communication channel such as a wire and an optical fiber, or a wireless communication channel.

While the present invention has been described with reference to the exemplary embodiments described above, the present invention is not limited to the above-described embodiments. The form and details of the present invention can be changed within the scope of the present invention in various manners that can be understood by those skilled in the art.

REFERENCE SIGNS LIST 10 management device
11 acquisition unit
12 accumulation unit
13 evaluation unit
14 specifying unit
15 output unit
16 step data storage unit
17 operation data storage unit
18 evaluation data storage unit
100 manufacturing management device
101 CPU
102 ROM
103 RAM
104 program group
105 storage device
106 drive
107 communication interface
108 input/output interface
109 bus
110 storage medium
111 communication network
121 acquisition unit
122 association unit

What is claimed is:

1. A manufacturing management method comprising:
   acquiring unique information of a product from a captured image of the product captured in a manufacturing step included in a manufacturing process of the product, and acquiring operation information representing an operation of a person who performs a manufacturing work on the product in the manufacturing step; and
   storing the acquired unique information of the product and the acquired operation information in association with each other.

2. The manufacturing management method according to claim 1, further comprising
   when evaluating the product, acquiring the unique information of the product from the captured image of the product, and reading out the operation information stored in association with unique information that is identical to the acquired unique information.

3. The manufacturing management method according to claim 2, further comprising
   specifying a work operation of a person corresponding to the evaluation of the product, on the basis of the operation information that is read out when evaluating the product.

4. The manufacturing management method according to claim 3, further comprising
   specifying a correlation between a content of the evaluation of the product and the operation information, on a basis of the operation information that is read out when evaluating the product for each product having a different evaluation content.

5. The manufacturing management method according to claim 3, further comprising
   outputting operation assistance information for assisting a work operation of a person, on a basis of the evaluation of the product and the specified work operation of the person corresponding to the evaluation of the product.

6. The manufacturing management method according to claim 5, further comprising
   outputting the operation assistance information to the person who performs the manufacturing work on the product in the manufacturing step.

7. The manufacturing management method according to claim 5, further comprising
   acquiring, as the operation information, a person image obtained by capturing the person who performs the manufacturing work on the product in the manufacturing step, and
   generating the operation assistance information on a basis of the person image and outputting the operation assistance information.

8. The manufacturing management method according to claim 7, further comprising
   on a basis of the person image, generating the operation assistance information including text information for supporting the work operation of the person, and outputting the operation assistance information.

9. The manufacturing management method according to claim 3, further comprising
   storing the evaluation of the product and the specified work operation of the person corresponding to the evaluation of the product, in association with each other; and
   thereafter, acquiring the unique information of the product from the captured image of the product captured in the manufacturing step, acquiring the operation information of the person who performs the manufacturing work on the product in the manufacturing step, and determining the evaluation of the product stored in association with the work operation of the person corresponding to the acquired operation information, to be evaluation of quality of the product having the acquired unique information.

10. The manufacturing management method according to claim 1, further comprising
acquiring the unique information of the product from a captured image of the product captured for each manufacturing step, and acquiring the operation information in the manufacturing step;
storing the unique information of the product and the operation information, acquired in an identical manufacturing step, in association with each other;
when evaluating the product, acquiring the unique information of the product from the captured image of the product, and reading out the operation information for each manufacturing step stored in association with unique information that is identical to the acquired unique information; and
specifying a work operation of a person corresponding to the evaluation of the product, on a basis of the readout operation information for each manufacturing step.

11. A manufacturing management device comprising:
at least one memory configured to store instructions; and
at least one processor configured to execute instructions to:
acquire unique information of a product from a captured image of the product captured in a manufacturing step included in a manufacturing process of the product, and acquire operation information representing an operation of a person who performs a manufacturing work on the product in the manufacturing step, and
store the acquired unique information of the product and the acquired operation information in association with each other.

12. The manufacturing management device according to claim 11, wherein the at least one processor is configured to execute the instructions to
when evaluating the product, acquire the unique information of the product from the captured image of the product, and read out the operation information stored in association with unique information that is identical to the acquired unique information.

13. The manufacturing management device according to claim 12, wherein the at least one processor is configured to execute the instructions to
specify a work operation of a person corresponding to the evaluation of the product, on a basis of the operation information that is read out when the product is evaluated.

14. The manufacturing management device according to claim 12, wherein the at least one processor is configured to execute the instructions to
specify a correlation between a content of the evaluation of the product and the operation information, on a basis of the operation information that is read out when the product is evaluated for each product having a different evaluation content.

15. The manufacturing management device according to claim 13, wherein the at least one processor is configured to execute the instructions to
store the evaluation of the product and the the specified work operation of the person corresponding to the evaluation of the product, in association with each other, and
thereafter, acquire the unique information of the product from the captured image of the product captured in the manufacturing step, acquire the operation information of the person who performs the manufacturing work on the product in the manufacturing step, and determine the evaluation of the product stored in association with the work operation of the person corresponding to the acquired operation information, to be evaluation of quality of the product having the acquired unique information.

16. The manufacturing management device according to claim 13, wherein the at least one processor is configured to execute the instructions to
output operation assistance information for assisting a work operation of a person, on a basis of the evaluation of the product and the specified work operation of the person corresponding to the evaluation of the product.

17. The manufacturing management device according to claim 16, wherein the at least one processor is configured to execute the instructions to
output the operation assistance information to the person who performs the manufacturing work on the product in the manufacturing step.

18. The manufacturing management device according to claim 16, wherein the at least one processor is configured to execute the instructions to
acquire, as the operation information, a person image obtained by capturing the person who performs the manufacturing work on the product in the manufacturing step, and
generate the operation assistance information on a basis of the person image and output the operation assistance information.

19. The manufacturing management device according to claim 18, wherein the at least one processor is configured to execute the instructions to
generate the operation assistance information including text information for supporting the work operation of the person on a basis of the person image, and output the operation assistance information.

20. A non-transitory computer-readable storage medium in which a program is stored, the program comprising instructions for causing an information processing device to execute processing of:
acquiring unique information of a product from a captured image of the product captured in a manufacturing step included in a manufacturing process of the product, and acquiring operation information representing an operation of a person who performs a manufacturing work on the product in the manufacturing step, and
storing the acquired unique information of the product and the acquired operation information in association with each other.

* * * * *